United States Patent
Ouyang et al.

(10) Patent No.: US 11,211,244 B2
(45) Date of Patent: Dec. 28, 2021

(54) ULTRAVIOLET RADIATION ACTIVATED ATOMIC LAYER DEPOSITION

(71) Applicant: Taiwan Semiconductor Manufacturing Co., Ltd., Hsinchu (TW)

(72) Inventors: Christine Y. Ouyang, Hsinchu (TW); Ziwei Fang, Hsinchu (TW)

(73) Assignee: Taiwan Semiconductor Manufacturing, Co., Ltd., Hsinchu (TW)

(*) Notice: Subject to any disclaimer, the term of this patent is extended or adjusted under 35 U.S.C. 154(b) by 24 days.

(21) Appl. No.: 16/745,532

(22) Filed: Jan. 17, 2020

(65) Prior Publication Data

US 2021/0225644 A1 Jul. 22, 2021

(51) Int. Cl.
| | |
|---|---|
| H01L 21/00 | (2006.01) |
| H01L 21/02 | (2006.01) |
| C23C 16/02 | (2006.01) |
| C23C 16/455 | (2006.01) |
| H01L 21/768 | (2006.01) |
| H01L 21/8234 | (2006.01) |
| H01L 21/285 | (2006.01) |

(52) U.S. Cl.
CPC ........ *H01L 21/02348* (2013.01); *C23C 16/02* (2013.01); *C23C 16/45529* (2013.01); *C23C 16/45536* (2013.01); *H01L 21/0262* (2013.01); *H01L 21/02172* (2013.01); *H01L 21/28556* (2013.01); *H01L 21/76825* (2013.01); *H01L 21/76862* (2013.01); *H01L 21/82345* (2013.01)

(58) Field of Classification Search
None
See application file for complete search history.

(56) References Cited

U.S. PATENT DOCUMENTS

| | | | |
|---|---|---|---|
| 7,045,430 B2 * | 5/2006 | Ahn | H01L 21/02178 257/E21.274 |
| 2011/0147831 A1 * | 6/2011 | Steigerwald | H01L 21/823821 257/330 |
| 2017/0044667 A1 * | 2/2017 | Yeh | C23C 16/452 |

* cited by examiner

*Primary Examiner* — Reema Patel
(74) *Attorney, Agent, or Firm* — Sterne, Kessler, Goldstein & Fox P.L.L.C.

(57) ABSTRACT

The present disclosure relates to a method of fabricating a semiconductor structure, the method includes forming an opening and depositing a metal layer in the opening. The depositing includes performing one or more deposition cycles, wherein each deposition cycle includes flowing a first precursor into a deposition chamber and performing an ultraviolet (UV) radiation process on the first precursor. The method further includes performing a first purging process in the deposition chamber to remove at least a portion of the first precursor, flowing a second precursor into the deposition chamber, and purging the deposition chamber to remove at least a portion of the second precursor.

20 Claims, 13 Drawing Sheets

ULTRAVIOLET RADIATION ACTIVATED ATOMIC LAYER DEPOSITION

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1:
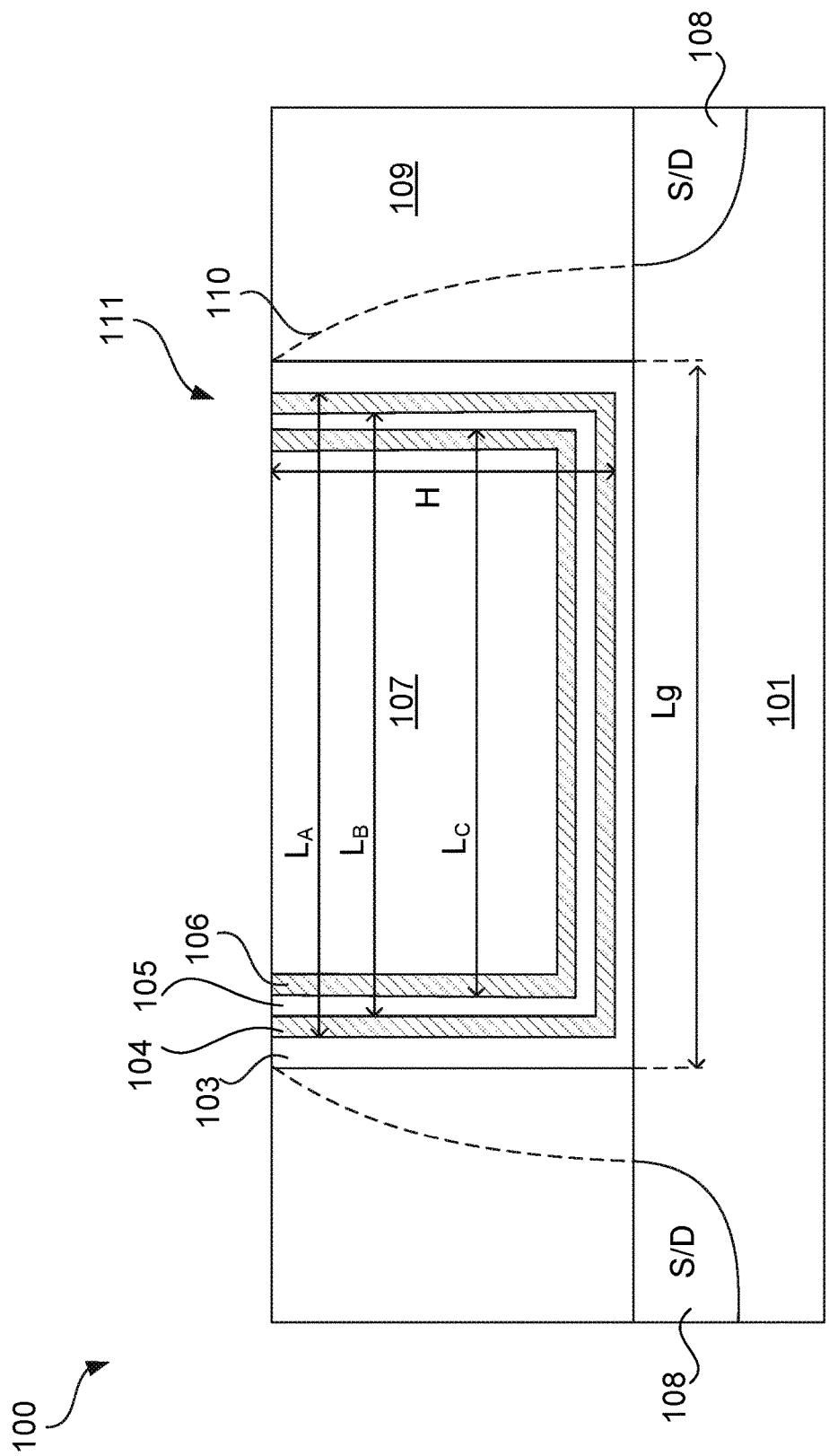
FIGS. 1-3B are views of semiconductor structures, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The acronym "FET," as used herein, refers to a field effect transistor. An example of a FET is a metal oxide semiconductor field effect transistor (MOSFET). MOSFETs can be, for example, (i) planar structures built in and on the planar surface of a substrate such as a semiconductor wafer or (ii) built with vertical structures.

The term "FinFET" refers to a FET that is formed over a fin that is vertically oriented with respect to the planar surface of a wafer.

"S/D" refers to the source and/or drain junctions that form two terminals of a FET.

The term "vertical," as used herein, means nominally perpendicular to the surface of a substrate.

The expression "epitaxial layer" refers to a layer or structure of single crystal material. Likewise, the expression "epitaxially grown" refers to a layer or structure of single crystal material. Epitaxially-grown material may be doped or undoped.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of the value (e.g., ±1%, ±2%, ±3%, ±4%, ±5% of the value).

Replacement metal gate and high-k gate dielectrics are used in scaled planar and FinFET-based devices for improved circuit performance. For example, metal gate electrodes and high-k gate dielectric layers (i.e., gate dielectric layers having dielectric constant greater than 3.9) can respectively replace polysilicon gate electrodes and silicon dioxide dielectric layers to achieve reduced gate leakage and improved drive current. One process of implementing metal gates is termed a "gate last" or "replacement gate" process. Such process includes forming a sacrificial polysilicon gate, performing various processes associated with the semiconductor device, removing the sacrificial gate to form a trench or opening, and depositing metal gate material in the trench or opening to form a metal gate.

As technologies progress, integrated circuits are characterized by decreasing dimension requirements over previous generation devices. However, there are challenges to implement such features and processes; for example, decreased critical dimensions of a photolithography process can result in openings having a higher aspect ratio (i.e., depth to width ratio of the opening). As an example, such high aspect ratio openings can be formed during a metal gate replacement process after a sacrificial gate structure is removed and prior to depositing gap filling layers. During the deposition of gap filling layers, such as work function layers, gate electrodes, and metal source/drain contacts, high aspect ratios can be one of the reasons for pre-mature sealing and/or form defects in the gap fill material. Defects can include voids and poor step coverage, which can be discontinuities in the deposited material on sidewall or bottom surfaces of the gap. The defects and poor step coverage can in turn lead to poor device performance.

ALD processes feature sequential alternating exposure of chemical precursors that reacts with the substrate. In an ALD process, a first precursor is pulsed into a reaction chamber under vacuum for a predetermined amount of time to allow the first precursor to fully react with the substrate surface. Subsequently, the reaction chamber is purged with an inert gas to remove any unreacted precursor and reaction by-products. A second precursor is then pulsed into the reaction chamber to react with the reacted first precursor and form one or more atomic layers (collectively called "a sublayer") of the desired material. This process is then cycled until a nominal film thickness is achieved. Although ALD processes provide relatively conformal film deposition in a variety of structures and surfaces, impurities in the films due to processing byproducts can still remain in the deposited film.

Various embodiments in accordance with this disclosure provide methods of forming metal layers with improved purity levels. For example, the metal layers with improved purity levels can have impurity levels less than about 3% in atomic percent. In some embodiments, the impurity level can be less than about 3%. In some embodiments, the impurity level can be between about 1% and about 3%. In some embodiments, the layers with improved purity formed using methods described in the present disclosure can include metal compound layers and are collectively described as "metal layers" for simplicity. The metal layers with improved purity levels can be formed using a multi-cycle deposition and in-situ ultraviolet (UV) radiation activation process. The formation process can include flowing a first precursor into a deposition chamber, applying UV radiation in-situ to activate functional groups of the first precursor, purging the chamber to remove excessive first precursor material, flowing a second precursor into the deposition chamber, applying UV radiation in-situ to activate functional groups of the second precursor, purging the chamber to remove excessive second precursors, and repeating the deposition cycle until a nominal thickness of the metal material is deposited. The UV activation process can be performed in-situ (e.g., performed in the same chamber as the multi-cycle deposition process). In some embodiments, the ALD deposition process can be completed without activating plasma. Nominal thickness and quality of the deposited metal layers can be varied by adjusting at least choice of precursors, choice of UV wavelengths, number of deposition cycles, other suitable parameters, and/or combinations thereof.

In accordance with various embodiments of this disclosure, using the deposition and in-situ UV activation process to form metal layers in semiconductor structures provides, among other things, benefits of (i) high device reliability and performance due to lower impurity level in the metal layers; and (ii) improved step coverage in high aspect ratio structures due to uniform growth.

The present disclosure presents embodiments directed to gate stack formation and related gate stack structures, which may be employed in multiple technology nodes and in a variety of device types. In some embodiments, the metal layers and methods for forming the same can be incorporated in technology nodes of 7 nm or less. For example, embodiments described herein may also be applied in 3 nm technology nodes. In some embodiments, gate stacks can be suitable for use in planar bulk metal-oxide-semiconductor field-effect transistors (MOSFETs), multi-gate transistors (planar or vertical) such as FinFET devices, gate-all-around (GAA) devices, Omega-gate (Ω-gate) devices, or Pi-gate (π-gate) devices, as well as strained-semiconductor devices, silicon-on-insulator (SOI) devices, partially-depleted SOI devices, fully-depleted SOI devices, or other devices. In addition, embodiments disclosed herein may be employed in the formation of p-type and/or n-type devices. Other semiconductor structures may also benefit from embodiments of the present disclosure, such as contacts and interconnects.

The term "in-situ" is used to describe processes that are performed while a device or wafer remains within a processing system (e.g., including a load lock chamber, transfer chamber, processing chamber, or any other processing chamber), and where for example, the processing system allows the substrate to remain under vacuum conditions. As such, the term "in-situ" may also generally be used to refer to processes in which the device or substrate being processed is not exposed to an external ambient (e.g., external to the processing system).

FIGS. 1-4 illustrate metal layer fabrication processes in various semiconductor devices based on embodiments of the multi-step deposition and UV activated ALD method. The fabrication process can produce metal layers having low impurity and improved step coverage (e.g., substantially uniform and continuous coverage of material) in high aspect ratio openings. Although fabrication processes of planar devices and multi-fin FinFET are described here as examples, the fabrication process can be applied in various semiconductor structures, such as trenches or gaps with low or high aspect ratios, single-fin FinFETs, and any other suitable semiconductor structure. The fabrication processes provided here are exemplary, and alternative processes in accordance with this disclosure may be performed that are not shown in these figures. Some embodiments of the present disclosure provide methods for manufacturing n-type and p-type devices using a replacement gate process. For example, fabrication processes of n-MOS and p-MOS devices are introduced.

FIG. 1 shows a cross-sectional view of a semiconductor device 100 incorporating metal gap fill layers, in accordance with some embodiments. In some embodiments, semiconductor device 100 is a planar n-MOS device. As discussed above, a replacement gate process includes forming an opening in an ILD layer after the sacrificial polysilicon is removed. As shown in FIG. 1, a gate trench 111 is formed between opposing surfaces of ILD 109 and a top surface of semiconductor substrate 101. In FIG. 1, an n-type work function layer 105, a blocking layer 106, and a metal layer 107 are collectively referred to herein as "a metal gate stack" and is positioned over a semiconductor substrate 101. In FIG. 1, a high-k dielectric layer 103 and a barrier layer 104 are lined between semiconductor substrate 101 and the metal gate stack. An optional spacer 110 is formed on sidewalls of the metal gate stack to facilitate a subsequent source/drain alignment operation.

As shown in FIG. 1, the metal gate stack, high-k dielectric layer 103 and optional spacer 110 are positioned within an interlayer dielectric (ILD) 109 in a lateral direction. In FIG. 1, a source/drain (S/D) 108 is formed in the semiconductor substrate 101, and a distance between the source and the drain is gate length $L_g$. In some embodiments, the gate length $L_g$ of semiconductor device 100 can be about 16 nm. In some embodiments, gate length $L_g$ can be less than 16 nm. In some embodiments, gate length Lg can be greater than about 16 nm. Gate height H as measured from a bottom of barrier layer 104 to a top surface of metal layer 107 can be between about 10 nm and about 120 nm. In some embodiments, a distance $L_A$ between opposing sidewall surfaces of high-k dielectric layer 103 can be between about 10 nm and about 20 nm. In some embodiments, a distance $L_B$ between opposing sidewall surfaces of barrier layer 104 can be about 17 nm. In some embodiments, a distance $L_C$ between opposing sidewall surfaces of n-type work function layer 105 can be about 2 nm. In some embodiments, a p-MOS device can have a p-type work function layer lined between barrier layer 104 and n-type work function layer 105. In such cases, a distance between opposing sidewall surfaces of p-type work function layer can be about 8 nm.

Semiconductor substrate 101 can be a bulk semiconductor substrate on which various layers and device structure are formed. In some embodiments, semiconductor substrate 101 can include silicon or a compound semiconductor, such as gallium arsenide (GaAs), indium phosphide (InP), silicon germanium (SiGe), silicon carbide (SiC), other suitable semiconductor materials, and/or combinations thereof. In some embodiments, various layers can be formed on semiconductor substrate 101, such as dielectric layers, doped layers, polysilicon layers, conductive layers, other suitable layers, and/or combinations thereof. In some embodiments, various devices can be formed on semiconductor substrate 101, such as transistors, resistors, capacitors, other suitable devices, and/or combinations thereof.

High-k dielectric layer 103 can be any suitable material having dielectric constant greater than 3.9. For example, high-k dielectric layer 103 can include a high-k dielectric such as hafnium oxide ($HfO_x$). In some embodiments, high-k dielectric layer 103 can include other high-k dielectrics, such as lanthanum oxide (LaO), aluminum oxide ($Al_2O_3$), zirconium oxide (ZrO), titanium oxide (TiO), tantalum oxide ($Ta_2O_5$), yttrium oxide ($Y_2O_3$), strontium titanate (STO), barium titanate (BTO), hafnium silicate (HfSiO), silicon nitride ($Si_3N_4$), oxynitrides, any other suitable materials, and/or combinations thereof. High-k dielectric layer 103 can be formed by any suitable process such as ALD, chemical vapor deposition (CVD), metalorganic CVD (MOCVD), physical vapor deposition (PVD), thermal oxidation, any other suitable deposition techniques, and/or combinations thereof. In some embodiments, high-k dielectric layer 103 can have a thickness between about 10 Å and about 30 Å.

Barrier layer 104 can formed over the high-k dielectric layer 103, in accordance with some embodiments. Barrier layer 104 can function as a barrier to protect high-k dielectric layer 103 by preventing metal diffusion. In some embodiments, barrier layer 104 can include titanium nitride (TiN), tantalum nitride (TaN), any other suitable barrier layer material, and/or combinations thereof. Barrier layer 104 can be formed after high-k dielectric layer 103 and formed using various deposition techniques such as ALD, PVD, CVD, PECVD, other suitable deposition processes, and/or combinations thereof. In some embodiments, barrier layer 104 can have a substantially uniform thickness between about 10 Å and about 30 Å.

N-type work function layer 105 is deposited on barrier layer 104, in accordance with some embodiments. N-type work function layer 105 provides an appropriate work function value to achieve a nominal transistor threshold voltage for semiconductor device 100. In some embodiments, semiconductor device 100 can include one or more work function layers to achieve the nominal threshold voltage. In some embodiments, n-type work function layer 105 can include aluminum-doped titanium carbide (TiAlC), aluminum-doped tantalum carbide (TaAlC), titanium silicon carbide (TiSiC), any other suitable n-type work function layer material, and/or combinations thereof. N-type work function layer 105 can be formed after barrier layer 104 and formed using various deposition techniques such as ALD, PVD, CVD, PECVD, other suitable deposition processes, and/or combinations thereof. In some embodiments, n-type work function layer 105 can have a substantially uniform thickness between about 10 Å and about 50 Å.

As discussed above, FIG. 1 illustrates semiconductor device 100 as a planar n-MOS device. In some embodiments, semiconductor device 100 can also be a planar p-MOS device. A p-MOS device may include a p-type work function layer formed prior to the deposition of n-type work function layer 105 and is not shown in FIG. 1 for simplicity. In some embodiments, the p-type work function layer can be formed after the deposition of n-type work function layer 105 and before forming blocking layer 106.

The combined n-type and p-type work function layers can provide an appropriate work function value to achieve a nominal transistor threshold voltage for p-MOS devices. In some embodiments, the p-MOS device can include more than two work function layers to achieve a nominal threshold voltage. In some embodiments, p-type work function layer can include TiN, high-k capping TiN, any other suitable work function layer material, and/or combinations thereof. A p-type work function layer can be formed after an n-type work function layer and can be formed using various deposition techniques, such as ALD, PVD, CVD, PECVD, other suitable deposition processes, and/or combinations thereof. In some embodiments, p-type work function layer can have a substantially uniform thickness between about 5 Å and about 50 Å.

Blocking layer 106 can be formed on n-type work function layer 105, in accordance with some embodiments. Blocking layer 106 may be formed on a p-type work function layer, in accordance with some embodiments. Blocking layer 106 can be formed on the work function layers in an in-situ manner, preventing the underlying work function layer from contamination or oxidation. Blocking layer 106 can include TiN, TaN, TSN, any other suitable material, and/or combinations thereof. In some embodiments, blocking layer 106 can have a thickness ranging from about 5 Å to about 40 Å. Blocking layer 106 can be formed by various deposition techniques, such as ALD, PVD, CVD, PECVD, or any other suitable techniques. In some embodiments, blocking layer 106 can be an optional layer that can be removed.

In some embodiments of the present disclosure, metal layer 107 is formed to fill in a remainder of a gate trench in the metal gate stack. The remainder of the gate trench can be a high aspect ratio trench, such as trenches having aspect ratios greater than about 6. Metal layer 107 can include any metal material suitable for forming a metal gate or portion thereof and formed using UV activated ALD process. For example, metal layer 107 can be formed by performing a plurality of UV activated ALD deposition cycles until metal gate trench is filled with metal layer 107. In some embodiments, metal layer 107 can include tungsten. In some embodiments, metal layer 107 can be formed using tungsten nitride (WN), TaN, ruthenium, silver, aluminum, any other suitable material, and/or combinations thereof. In some embodiments, metal layer 107 can be formed using a damascene process followed by a planarization process (e.g., a chemical mechanical polishing process) to remove any excessive material formed on the top surface of ILD 109. In some embodiments, metal layer 107 can also be formed using any deposition processes, such as CVD, PVD, sputtering, any suitable deposition processes, and/or combinations thereof.

In some embodiments, ILD 109 can include a dielectric material. In some embodiments, the dielectric material can include silicon oxide, silicon nitride, silicon oxynitride, spin-on glass (SOG), fluorinated silica glass (FSG), carbon doped silicon oxide (e.g., SiCOH), amorphous fluorinated carbon, Parylene, bis-benzocyclobutenes, polyimide, other proper porous polymeric materials, other suitable dielectric materials, and/or combinations thereof. In some embodiments, ILD 109 can include a high density plasma (HDP) dielectric material (e.g., HDP oxide) and/or a high aspect ratio process (HARP) dielectric material (e.g., HARP oxide). ILD 109 can also include one or more dielectric materials and/or one or more dielectric layers. ILD 109 can be planarized by a chemical-mechanical-polishing process until a top portion of the metal gate stack is exposed as illustrated in FIG. 1. The CMP process includes a high selectivity to provide a substantially planar surface for the metal gate stack, spacers 110, and ILD 109. In some embodiments, the CMP process has low dishing and/or metal erosion effect.

In some embodiments, in addition to the layers described above, semiconductor device 100 may further include liner layers, interfacial layer, seed layers, adhesion layers, barrier layers, or their equivalents.

Figure 2:
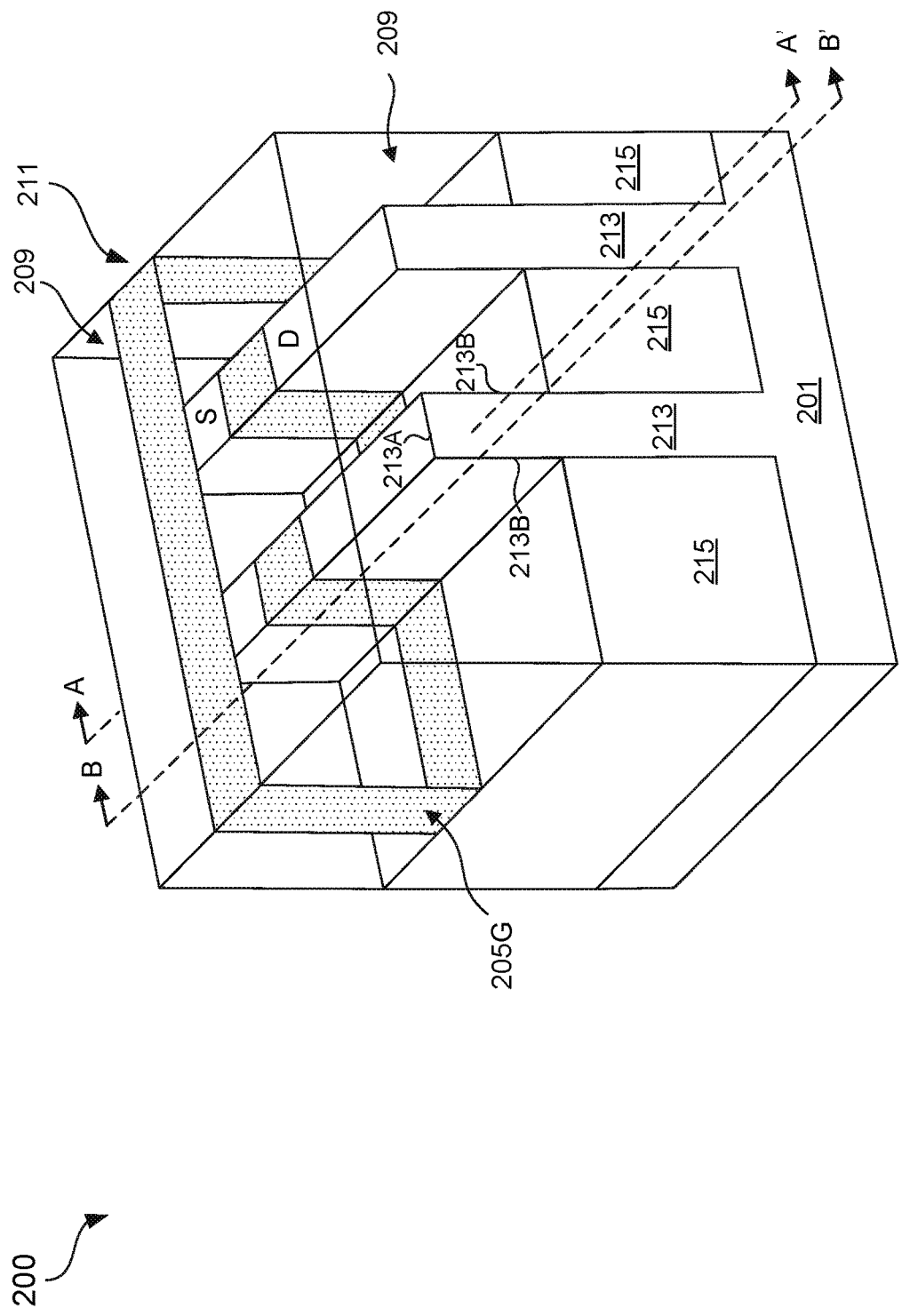
Figure 3A:
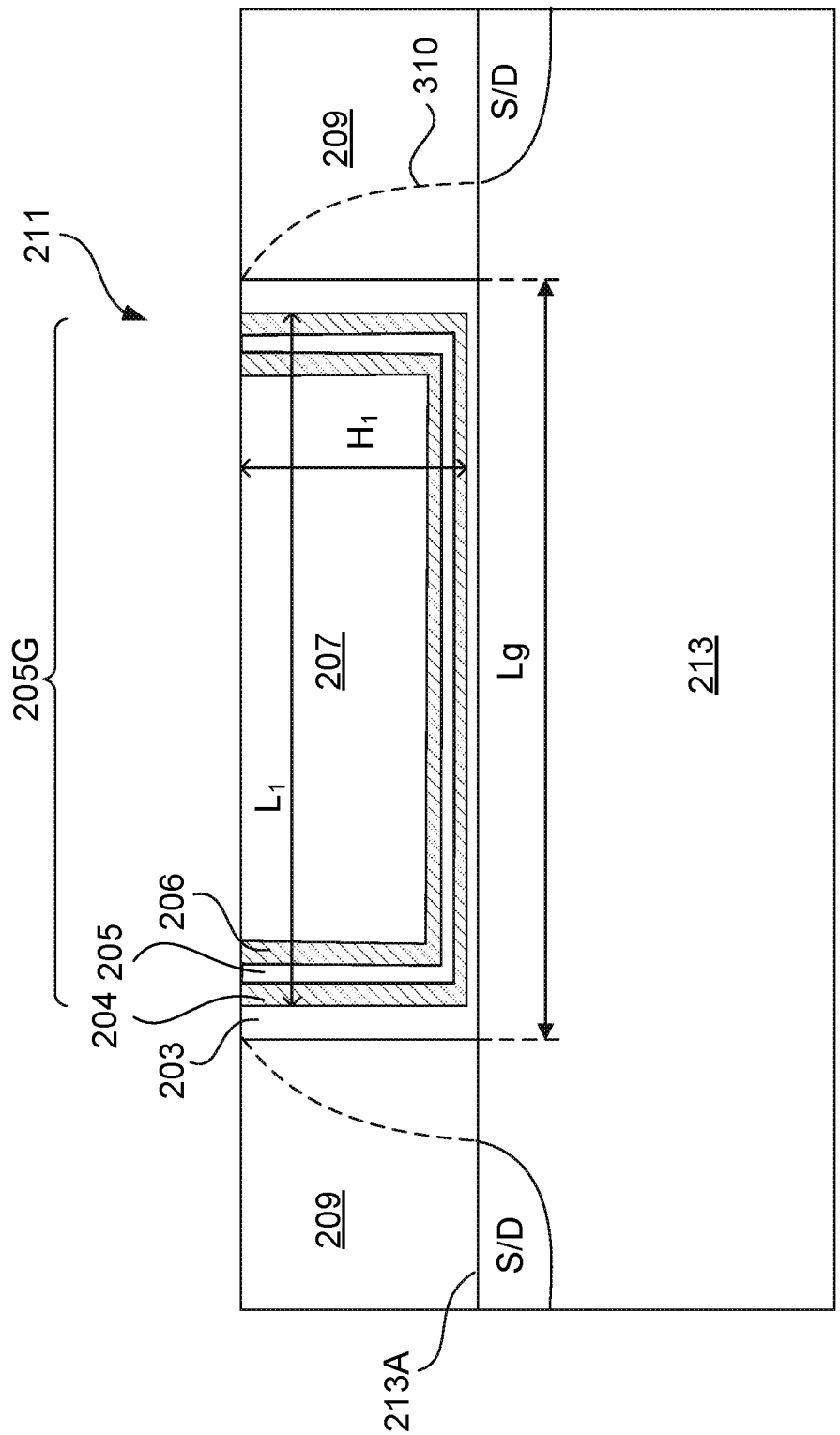
Figure 3B:
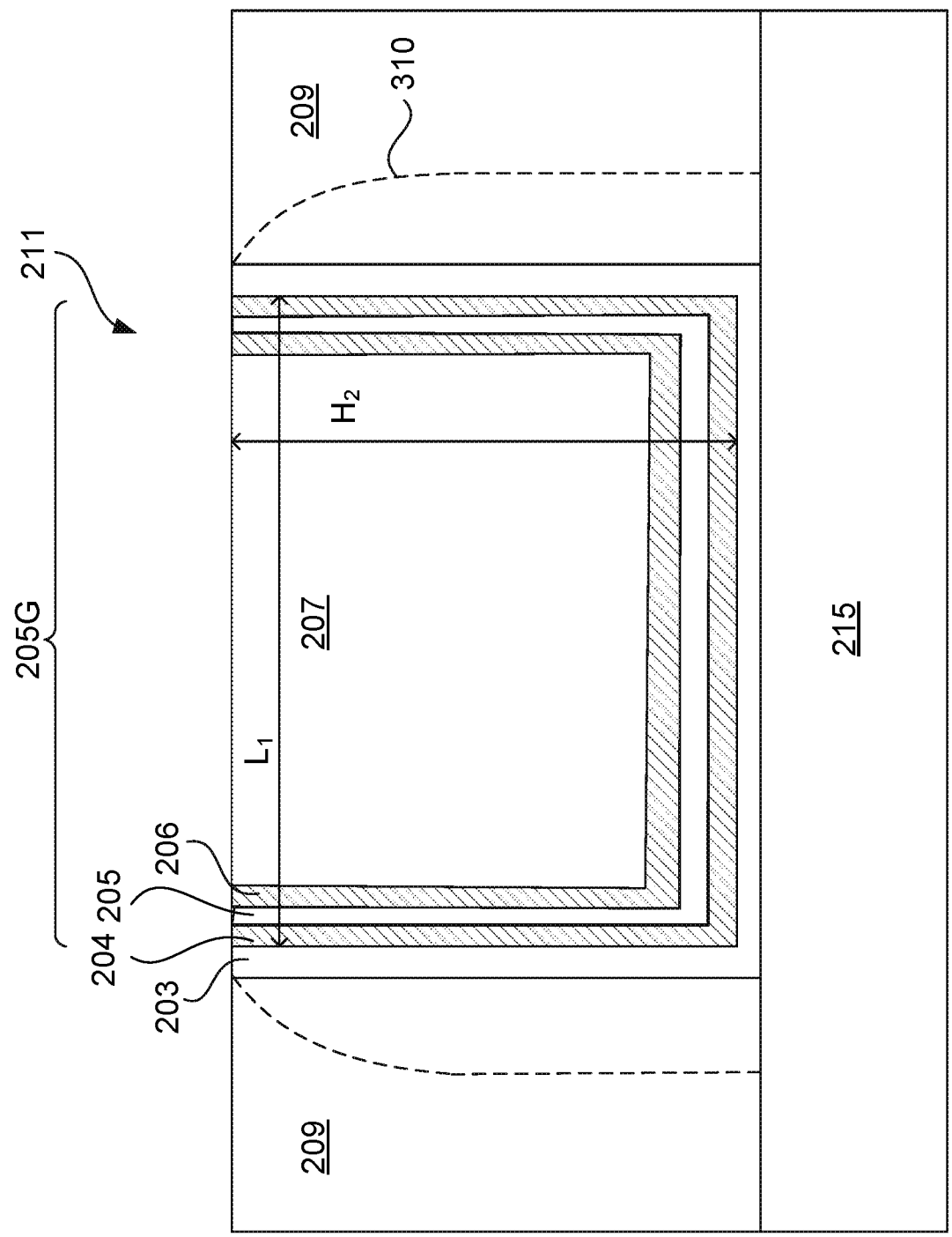

FIGS. 2 and 3A-3B illustrate various views of a metal gate FinFET structure 200. As shown in FIGS. 3A and 3B, metal gate FinFET structure 200 can include barrier layers, work function layers, and blocking layers. FinFET structure 200 also includes metal layers formed in high aspect ratio openings using UV activated ALD deposition processes to produce a low impurity metal fill layer with high uniformity. For example, variation of a thickness of the metal fill layer can be less than about 3%. As an example, metal gate FinFET structure 200 illustrated in the present disclosure can be an n-type FinFET having one or more n-type work function layers. Metal gate FinFET structure 200 can also include a p-type FinFET with one or more n-type and p-type work function layers formed using the UV activated ALD deposition to provide improved purity levels and improved step coverage.

Referring to FIG. 2, a perspective view of metal gate FinFET structure 200 is shown. Two semiconductor fins 213 are positioned on a substrate 201 and are separated by shallow trench isolation 215. Semiconductor fin 213 can be formed of silicon, silicon-germanium, germanium, or other suitable semiconductor materials. A metal gate 205G is formed over top surface 213A and sidewalls 213B of semiconductor fins 213. A channel of FinFET structure 200 (not shown) is defined along top surface 213A and sidewalls 213B of semiconductor fin 213 and extended between source/drain (S and D) in the semiconductor fin 213. As shown in FIG. 2, ILD 209 is formed over top surface 213A and sidewalls 213B at the S/D portions of the semiconductor fins 213. Shallow trench isolation 215 is formed on substrate 201 and between adjacent semiconductor fins 213. Metal gate can be formed using a replacement gate process where a sacrificial polysilicon gate structure is removed from ILD 209, leaving an opening where a metal gate structure can be deposited. In some embodiments, the opening can be a high aspect ratio opening having an aspect ratio between about 6 and about 60.

Semiconductor substrate 201 can be a bulk semiconductor substrate on which various layers and device structures are formed. In some embodiments, semiconductor substrate 201 can be similar to semiconductor substrate 101 as described above in FIG. 1 and is not repeated here for simplicity. In some embodiments, semiconductor substrate 201 can be different from semiconductor substrate 101. In some embodiments, various layers and devices can be formed on semiconductor substrate 201. These layers include, for example, dielectric layers, doped layers, polysilicon layers, conductive layers, other suitable layers, and/or combinations thereof. Multiple devices can be interconnected through an interconnect layer to additional integrated circuits.

Referring to FIG. 3A and FIG. 3B, two cross-sectional views of metal gate FinFET structure 200 are shown. The cross section shown in FIG. 3A is viewed from a first direction of metal gate FinFET structure 200 of FIG. 2. The first direction is cut through semiconductor fin 213 and parallel to a longitudinal axis of semiconductor fin 213 and is denoted as "A-A'." The cross section shown in FIG. 3B is viewed from a second direction of metal gate FinFET structure 200 of FIG. 2. The second direction is through shallow trench isolation 215 and also parallel to a longitudinal axis of semiconductor fin 213 and is denoted as "B-B'." Gate trench 211 is formed between opposing surfaces of ILD 209 and top surface 213A of semiconductor fin 213 as shown in FIG. 3A or between opposing surfaces of ILD 209 and top surface of shallow trench isolation 215 as shown in FIG. 3B. An optional spacer 310 is formed on sidewalls of the metal gate stack to facilitate a subsequent source/drain alignment operation. Spacer 310 can be similar to spacer 110 described above in FIG. 1 and is not described in detail here for simplicity.

In FIG. 3A, metal gate stack 205G is positioned on semiconductor fin 213 and in gate trench 211. Metal gate stack 205G can include barrier layer 204, n-type work function layer 205, blocking layer 206, and metal layer 207. A channel length $L_g$ is measured along top surface 213A of semiconductor fin 213 and extended between a source (S) and a drain (D) in semiconductor fin 213. In some embodiments, the channel length $L_g$ in metal gate FinFET structure 200 is less than about 16 nm. In some embodiments, the channel length $L_g$ can be greater than about 16 nm. A height $H_1$ of metal gate stack 205G is a length measured from a leveled top surface of metal layer 207 to a bottom surface of barrier layer 204. In some embodiments, the height $H_1$ of metal gate stack 205G can be from about 20 nm to about 120 nm. A distance $L_1$ between opposing surfaces of high-k dielectric layer 203 can be between about 10 nm and about 20 nm. In some embodiments, an aspect ratio of metal gate stack 205G can be in a range of from about 6 to about 12. The aspect ratio of metal gate stack 205G refers to a ratio of height $H_1$ over distance $L_1$. The greater the aspect ratio of the gate trench, the greater the difficulty of depositing substantially uniform films with improved step coverage. In some embodiments, a distance between opposing surfaces of barrier layer 204 can be about 17 nm. In some embodiments, a distance between opposing surfaces of n-type work function layer 205 can be about 2 nm. In some embodiments, a p-type FinFET structure can have a p-type work function layer lined between barrier layer 204 and n-type work function layer 205. In such cases, a distance between opposing surfaces of p-type work function layer can be about 8 nm.

High-k dielectric layer 203 can be any suitable material having dielectric constant greater than 3.9. High-k dielectric layer 203 can be similar to high-k dielectric layer 103 described above in FIG. 1 and is not described in detail here for simplicity. In some embodiments, high-k dielectric layer 203 can include a high-k dielectric, such as hafnium oxide ($HfO_x$). High-k dielectric layer 203 can be formed using a similar process used to form high-k dielectric layer 103. In some embodiments, high-k dielectric layer 203 can be formed using a different deposition process. In some embodiments, high-k dielectric layer 203 can have a thickness between about 10 Å and about 20 Å.

Barrier layer 204 can be formed over high-k dielectric layer 203, in accordance with some embodiments. Barrier layer 204 can be similar to barrier layer 104 as described above in FIG. 1 and is not described in detail here for simplicity. In some embodiments, barrier layer 204 can include TiN, TaN, any other suitable barrier layer material, and/or combinations thereof. Barrier layer 204 can be formed after high-k dielectric layer 203 and formed using various deposition techniques, such as ALD, PVD, CVD, PECVD, other suitable deposition processes, and/or combinations thereof. In some embodiments, barrier layer 204 can have a substantially uniform thickness between about 10 Å and about 30 Å.

N-type work function layer 205 is deposited on barrier layer 204, in accordance with some embodiments. N-type work function layer 205 can be similar to n-type work function layer 105 described above in FIG. 1 and is not described in detail here for simplicity. In some embodiments, n-type work function layer 205 can include TiAlC, TaAlC, TiSiC, any other suitable barrier layer material, and/or combinations thereof. N-type work function layer 205 can be formed using various deposition techniques, such as ALD, PVD, CVD, PECVD, other suitable deposition processes, and/or combinations thereof. N-type work function layer 205 can have a substantially uniform thickness between about 10 Å and about 50 Å.

Although FIG. 3A illustrates metal gate FinFET structure 200 as an n-type device, metal gate FinFET structure 200 can also include a p-type device. The p-type device can include a p-type work function layer formed prior to the deposition of n-type work function layer 205 and is not shown in FIG. 3A for simplicity. The formation of such p-type work function layer can be similar to the p-type work function layer described above with reference to FIG. 1 and is not described here in detail for simplicity.

Blocking layer 206 can be formed on n-type work function layer 205, in accordance with some embodiments. Blocking layer 206 can also be formed on a p-type work function layer in a p-type FinFET, in accordance with some embodiments. In some embodiments, the blocking layer 206 is an optional layer.

Metal layer 207 can be formed to fill in a remainder of a gate trench in metal gate stack 205G. Metal layer 207 can be similar to metal layer 107 as described above in FIG. 1 and is not described here in detail for simplicity. In some embodiments, metal layer 207 can include tungsten. In some embodiments, metal layer 207 can be formed using WN, TaN, ruthenium, silver, aluminum, any other suitable material, and/or combinations thereof. In some embodiments, metal layer 207 can be formed using UV activated ALD deposition that provides metal layers with low impurity and high uniformity. In some embodiments, UV activated ALD deposition can be used to deposit a metal seed layer or a metal liner layer along exposed surfaces of the gate trench to enable subsequent metal deposition such as electroplating. In some embodiments, metal layer 207 can be formed using a damascene process followed by a planarization process to remove any excessive material formed on the top surface of ILD 209. In some embodiments, metal layer 207 can also be formed using any deposition processes, such as CVD, PVD, sputtering, any suitable deposition processes, and/or combinations thereof.

In some embodiments, ILD 209 can include a dielectric material. In some embodiments, ILD 209 can be similar to ILD 109 as described above in FIG. 1 and is not described in detail here for simplicity. ILD 209 can be planarized by a chemical mechanical polishing process until a top portion of metal gate stack 205G is exposed as illustrated in FIG. 3A.

The cross section shown in FIG. 3B is cut from a second direction shown in FIG. 2. The second direction is cut through shallow trench isolation 215 and in parallel to a longitudinal axis of semiconductor fin 213 and is denoted as "B-B'." Elements with the same numeral labels in FIGS. 2, 3A, and 3B are directed to the same structure of materials and are not repeated here for simplicity. Shallow trench isolation 215 can be used to provide electrical insulation between adjacent devices and can be formed using low-k dielectric material (e.g., dielectric material having dielectric constant lower than 3.9). A gate height $H_2$ in FIG. 3B is measured from a top surface of metal layer 207 to a bottom surface of barrier layer 204. Gate height $H_2$ can be greater than gate height $H_1$ of FIG. 3A because gate height $H_2$ includes the height of both gate height H1 and also thickness of ILD 209 that is between top surface 213A of semiconductor fin 213 and top surface of metal layer 207. Therefore, the gate trench formed in ILD 209 as viewed in FIG. 3B during the gate replacement process can have a higher aspect ratio than the gate trench in FIG. 3A. For example, the aspect ratio can be between about 6 and about 60. In some embodiments, the height $H_2$ of the metal gate stack can be from about 120 nm to about 600 nm. A distance $L_1$ between opposing surfaces of high-k dielectric layer 203 can be between about 10 nm to about 20 nm.

Figure 4:
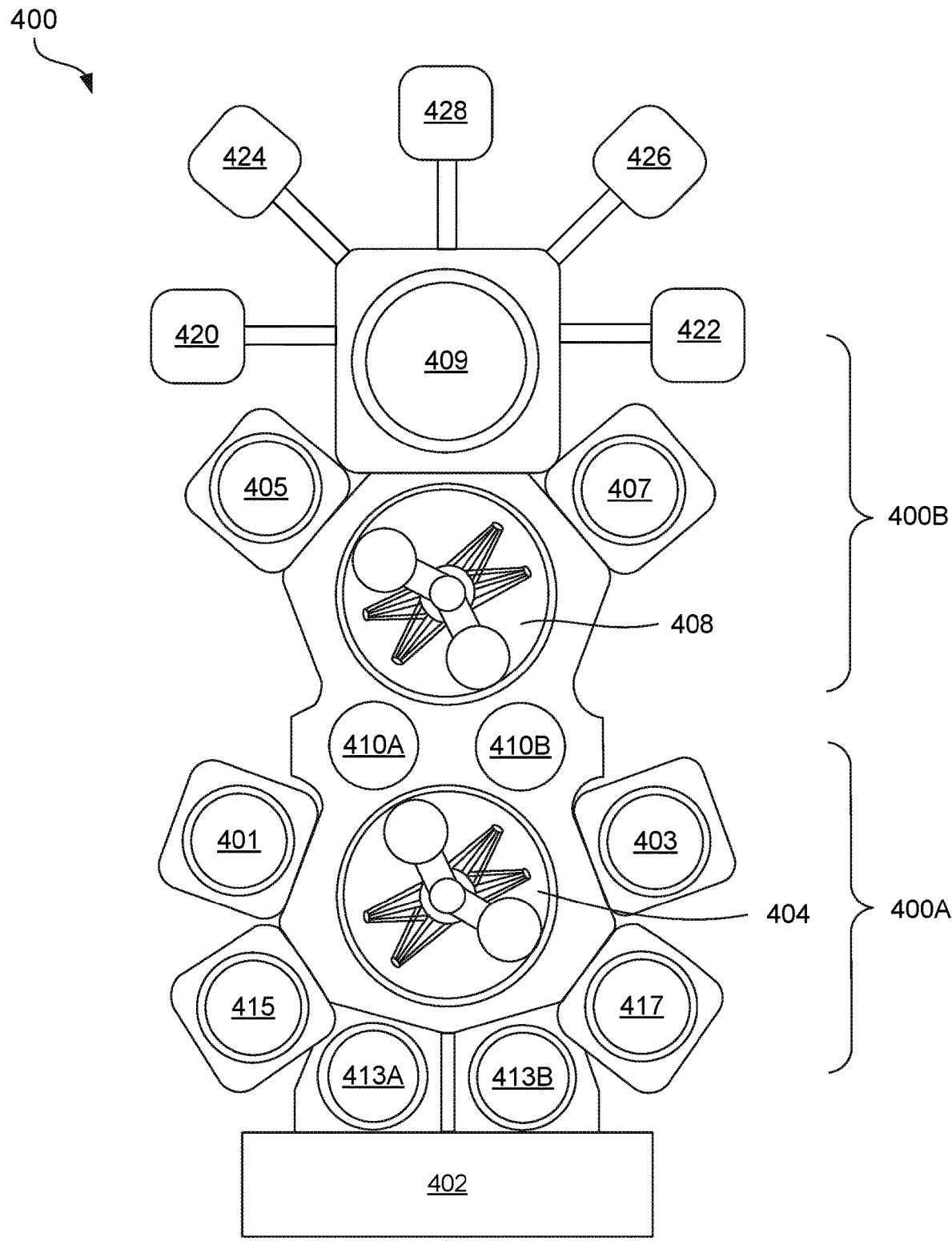
FIG. 4 is a configuration of a semiconductor wafer manufacturing system, in accordance with some embodiments.

Referring to FIG. 4, a configuration of a semiconductor wafer manufacturing system 400 used to perform UV activated ALD processes for forming thin metal films is illustrated. The semiconductor wafer manufacturing system 400 has several growth chambers arranged in each of the two clusters 400A and 400B. Semiconductor wafer manufacturing system 400 may also include other growth chambers for depositing dielectric layers, barrier layers, blocking layers, adhesion layers, anti-reflecting layers, and any other suitable layers. Each layer in the metal gate structures described above in FIGS. 1-3B can be formed in semiconductor wafer manufacturing system 400 without exposing the wafer to ambient contact between deposition processes.

Two load lock chambers 413A and 413B are configured to receive a wafer transferred from a load port 402. Load lock chambers 413A and 413B are vented to a pressure equivalent to the load port 402 while a wafer is transferred between load port 402 and load lock chambers 413A or 413B. When moving the wafer from load lock chamber 413A or 413B into one of the chambers in semiconductor wafer manufacturing system 400, load lock chambers 413A and 413B are pumped down to a certain degree of vacuum that is closer to the vacuum level inside the clusters 400A and 400B. Clusters 400A and 400B each has at least one mechanical means such as a robot arm 404 or 408 which transfers the wafer parked in the pumped-down load lock chamber 413A or 413B to one of the growth chambers. Semiconductor wafer manufacturing system 400 can also include degassing chambers 415 and 417 that are used to activate and remove gaseous and/or liquid substances, such as moisture and oxygen from substrates to prevent change in thin film characteristics and cause deposition failure.

In some embodiments, a dielectric deposition chamber 401 is attached to cluster 400A and is loaded with precursors for high-k dielectric growth. For example, to deposit high-k dielectric layers 103 and 203 as illustrated in FIGS. 1 and 2 respectively, precursors such as hafnium tetrachloride ($HfCl_4$), water ($H_2O$), and any other suitable precursors are provided to deposition chamber 401.

In some embodiments, a barrier layer deposition chamber 403 is attached to cluster 400A and is connected to precursor supplies for barrier layer growth. The precursors can be in a gas form. In some embodiments, deposition chamber 403 can be an ALD deposition chamber. In some embodiments, deposition chamber 403 can be maintained at a temperature between room temperature and about 200° C. In some embodiments, deposition chamber 403 can be maintained at a temperature between about 200° C. and about 1000° C. In some embodiments, deposition chamber 403 can be maintained at a chamber pressure between about 1 Torr and about 20 Torr. In some embodiments, barrier layer deposition chamber 403 can be connected to precursor supplies.

In some embodiments, an n-type work function layer deposition chamber 405 is attached to cluster 400B and is connected to precursor supplies for n-type work function layer deposition. For example, deposition chamber 405 can be loaded with precursors for deposition processes used to form n-type work function layers. In some embodiments, the precursors can be in gas form. In some embodiments, deposition chamber 405 can be an ALD deposition chamber. In some embodiments, deposition chamber 405 can be maintained at a temperature between room temperature and about 200° C. In some embodiments, deposition chamber 405 can be maintained at a temperature between about 200° C. and about 1000° C. In some embodiments, deposition chamber 405 can be maintained at a chamber pressure between about 1 Torr and about 20 Torr. In some embodiments, n-type work function layer deposition chamber 405 can be connected to precursor supplies.

In some embodiments, a p-type work function layer deposition chamber 407 is attached to cluster 400B and is connected to precursor supplies for p-type work function layer deposition. For example, deposition chamber 407 can be loaded with precursors for deposition processes used to form p-type work function layers. In some embodiments, deposition chamber 407 can be an ALD deposition chamber. In some embodiments, deposition chamber 407 can be maintained at a temperature between room temperature and about 200° C. In some embodiments, deposition chamber 407 can be maintained at a temperature between about 200° C. and about 1000° C. In some embodiments, deposition chamber 407 can be maintained at a chamber pressure between about 1 Torr and about 20 Torr. In some embodiments, n-type and p-type work function layer deposition chambers 405 and 407 can also be used to deposit blocking layers.

In some embodiments, a metal film deposition chamber 409 is attached to cluster 400B and can deposit metal films using UV activated ALD processes. For example, metal film deposition chamber 409 is connected to precursor supplies for metal layer deposition and UV radiation apparatus for applying UV radiation in-situ during the ALD deposition processes. For example, deposition chamber 409 can be loaded with precursors for multi-cycle deposition and used to form metal films such as metal films that form gate electrode for transistor devices. UV radiation apparatus can be any suitable equipment that can apply UV radiation into metal film deposition chamber 409. For example, precursor supplies 420 and 422 can be connected to deposition chamber 409 for supplying the deposition chamber with suitable precursors for depositing metal films. UV radiation sources 424 and 426 can also be connected to the chamber for applying UV radiation to wafers being processed in deposition chamber 409. In some embodiments, UV radiation sources 424 and 426 can be configured to provide UV radiation (e.g., radiation with wavelengths between about 100 nm and about 500 nm). UV radiation sources 424 and 426 can be configured to provide UV radiation with different wavelengths. For example, UV radiation source 424 can provide UV radiation with wavelengths between about 100 nm and about 300 nm. UV radiation source 426 can provide UV radiation with wavelengths between about 300 nm and about 500 nm. Purging lines 428 can also be connected to deposition chamber 409 for purging suitable gases into deposition chamber 409 and/or removing gases from deposition chamber 409. In some embodiments, purging lines 428 can provide purging gases such as hydrogen, helium, nitrogen, argon, any suitable purging gases, and/or combinations thereof. In some embodiments, deposition chamber 409 can be maintained at a temperature between room temperature and about 200° C. In some embodiments, deposition chamber 409 can be maintained at a temperature between about 200° C. and about 1000° C. In some embodiments, deposition chamber 409 can be maintained at a chamber pressure between about 1 Torr and about 20 Torr.

In some embodiments, cooling chambers 410A and 410B allow a wafer to cool down to a desired temperature at an appropriate cooling rate in between various thin film growths without ambient contact. In some embodiments, additional chambers can be included in semiconductor wafer manufacturing system 400 for depositing any suitable material used to form the semiconductor structures described above in FIGS. 1-3B. For example, metal layer deposition chambers can be included in semiconductor wafer manufacturing system 400 for depositing metal layers 107 and 207 that fills the gate trench. Metal layer deposition chambers can be connected to precursor supplies, such as tungsten or cobalt target and can be introduced with argon gas.

During the deposition of various layers in the deposition chambers of semiconductor wafer manufacturing system 400, the deposition chambers are kept under vacuum between the multi-cycle deposition and UV activation processes, such that no ambient contact or contamination is introduced. A user may enter a single recipe into a computer processor to control the deposition chamber for performing the multi-cycle deposition and UV activation processes. For example, the recipe can include deposition parameters for the first and second precursors in the multi-cycle deposition process, such as pulsing time, purging time, gas flow rate, chamber temperature, chamber pressure, plasma power, substrate bias, and/or any suitable deposition parameters. The recipe can also include processing parameters for the UV activation process, such as wavelengths and duration of the UV radiation, and/or any suitable processing parameters. Therefore, the entire deposition process for one or more layers can be controlled by a single recipe in the same chamber.

Each wafer is assigned with a sequence of operations according to an operating recipe to achieve automatic wafer processing in semiconductor wafer manufacturing system 400. In some embodiments, a substrate is first transferred from load lock chamber 413A and/or 413B to cluster 400A using robot arm 404. The wafer can be sent into chamber 415 or 417 for degassing and then to high-k dielectric layer deposition chamber 401 for dielectric layer deposition. For example, high-k dielectric layers 103 and 203 described above can be deposited in gate trenches using deposition chamber 401. In some embodiments, after a high-k dielectric layer is formed, the wafer can be then transferred from chamber 401 to deposition chamber 403 for the growth of barrier layer 104 or 204. In some embodiments, a barrier layer is optional and the wafer can be transferred from deposition chamber 401 to one of the deposition chambers in cluster 400B for subsequent depositions. For example, the wafer can be transferred to n-type work function layer deposition chamber 405 to deposit an n-type work function layer, in accordance with some embodiments. After the deposition of an n-type work function layer, the wafer can be transferred to p-type work function layer deposition chamber 407 for forming a p-type work function layer used in a p-type device such as a p-MOS device or p-type FinFET, in accordance with some embodiments. After the work function layers are deposited, a blocking layer can be deposited on the wafer, if necessary. A metal layer used to fill gate trenches can be deposited in metal layer deposition chamber 409 of semiconductor wafer manufacturing system 400, in accordance with some embodiments. The metal layer that fills the gate trenches can form gate electrodes, and can be formed using multi-cycle ALD deposition processes activated by UV radiation. After the metal layers are formed, the wafer can then be parked to load lock chambers 413A and 413B using robot arms 404 and 408. The vacuum level inside the load lock chambers chamber 413A and 413B are raised to a level comparable to load port 402, and the wafer is then transferred to load port 402 and taken out for subsequent operations. For example, after the formation of the metal gate structure, the wafer containing MOSFET or FinFET structures can undergo additional CMOS processing to form various devices. In some embodiments, the various features include, but is not limited to, lightly doped source/drain regions (n-type and p-type LDD), source/drain (S/D) regions, silicide features, and a contact etch stop layer (CESL). Strained structures such as silicon germanium (SiGe) and silicon carbide (SiC) features may be formed in the p-type and/or n-type devices, respectively.

Figure 5:
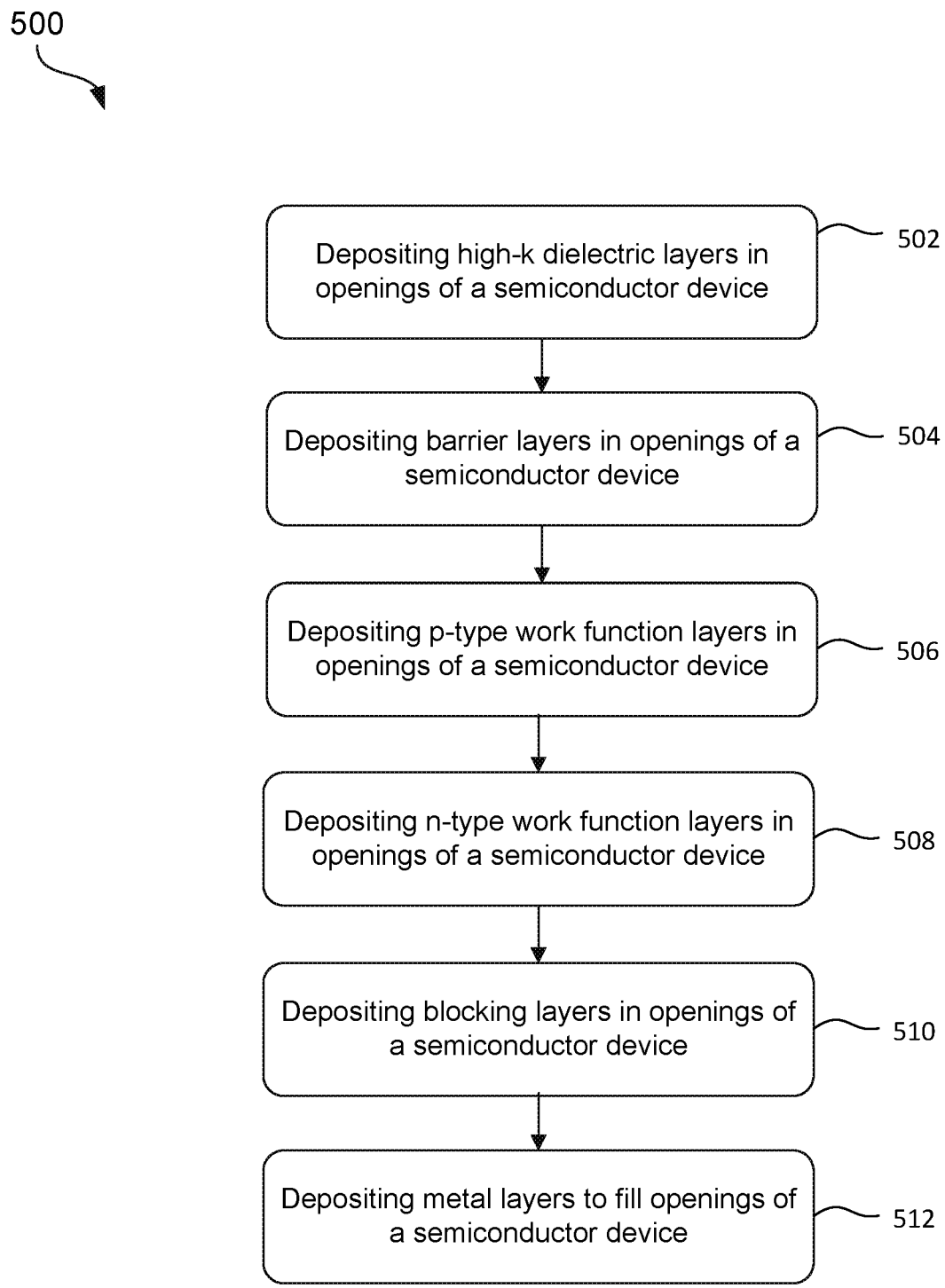
FIG. 5 is a flow diagram of an exemplary method of forming layers using multi-cycle deposition and UV activation processes, in accordance with some embodiments.

FIG. 5 is a flow diagram of an exemplary method 500 of forming dielectric layers and metal layers with improved uniformity and lower impurity level in semiconductor structures, in accordance with some embodiments of the present disclosure. Operations of method 500 can be performed in a different order and/or vary, and method 500 may include more operations and are not described for simplicity. Exemplary method 500 can also be used to form metal layers with improved purity levels. FIGS. 6A-6F are cross-sectional views of fabricating an exemplary semiconductor structure 600 utilizing an in-situ UV activation process for forming metal layers with improved step coverage and lower impurity. FIGS. 6A-6F are provided as exemplary cross-sectional views to facilitate in the explanation of method 500. Semiconductor structure 600 can include shallow trench isolation 615, ILD 609, and spacer 610 which are respectively similar to shallow trench isolation 215, ILD 209, and spacer 310 as described above in FIGS. 2-3B and are not described in detail here for simplicity. In some embodiments, shallow trench isolation 615 can be a portion of a semiconductor substrate.

Figure 6A:
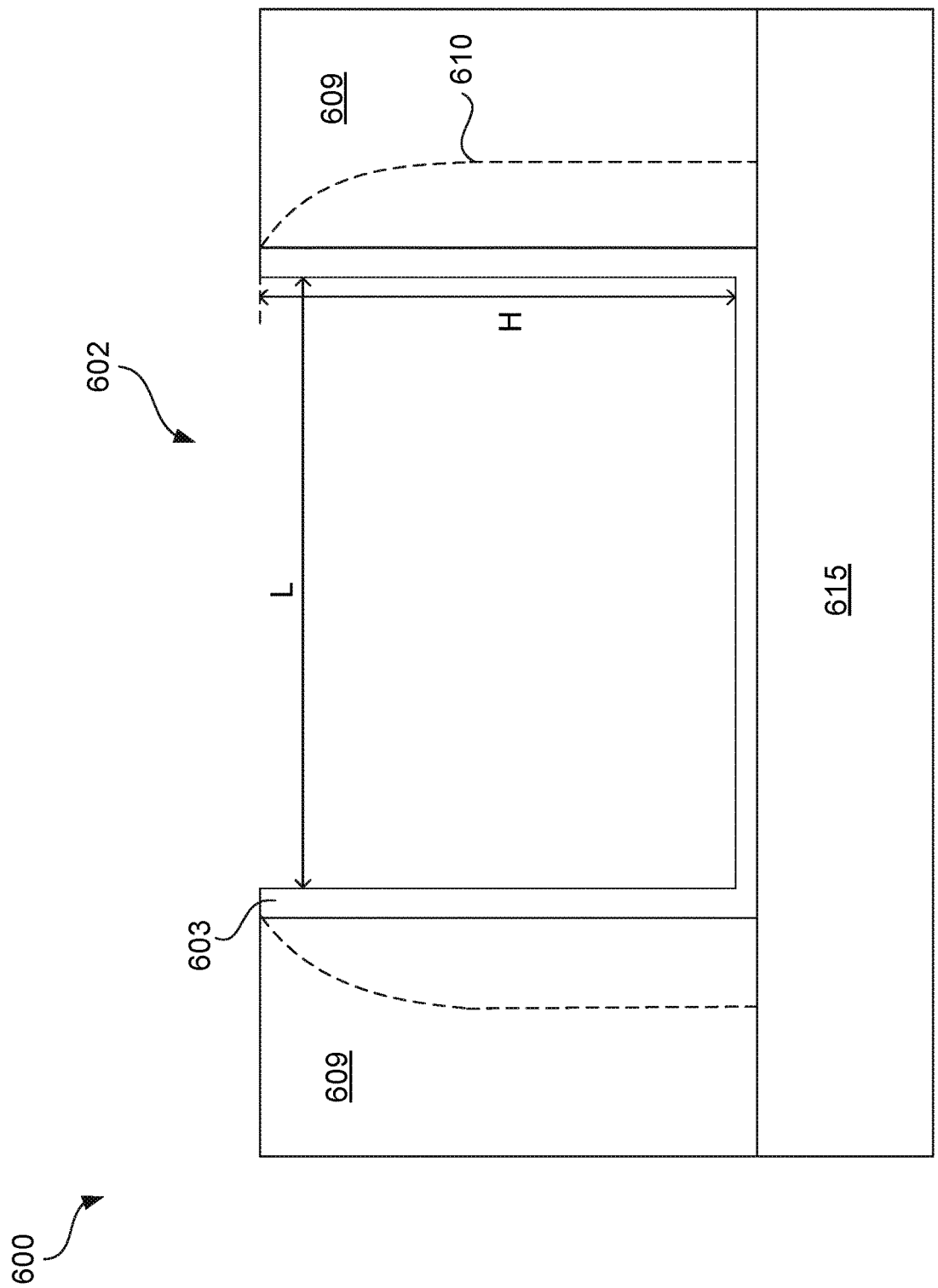
FIGS. 6A-6F are cross-sectional views of semiconductor structures, in accordance with some embodiments.

At operation 502, high-k dielectric layers are deposited in openings of a semiconductor device, in accordance with some embodiments of the present disclosure. The openings can be a high aspect ratio (e.g., greater than about 6) opening, such as gate trenches, vias, interconnects, and other high aspect ratio openings. Referring to FIG. 6A, a gate trench 602 is formed between exposed sidewall and bottom surfaces of high-k dielectric layer 603. Gate trench 602 can have a high aspect ratio (e.g., between about 6 and about 66) measured by dividing its height H by its width L. High-k dielectric layers can be deposited on sidewalls and bottom of gate trench 602. An example of a high-k dielectric layer is high-k dielectric layer 603 shown in FIG. 6A. High-k dielectric layers can be any suitable material having a dielectric constant greater than 3.9. For example, the high-k dielectric layers can include a high-k dielectric, such as $HfO_x$. In some embodiments, the high-k dielectric layer can include other high-k dielectrics, such as LaO, $Al_2O_3$, ZrO, TiO, $Ta_2O_5$, $Y_2O_3$, STO, BTO, HfSiO, $Si_3N_4$, oxynitrides, any other suitable materials, and/or combinations thereof. High-k dielectric layers can be formed by any suitable process, such as ALD, CVD, MOCVD, PVD, PECVD, PEALD, thermal oxidation, any other suitable deposition techniques, and/or combinations thereof. In some embodiments, the high-k dielectric layer can have a thickness between about 10 Å and about 20 Å. Other examples of high-k dielectric layers can be high-k dielectric layers 103 and 203 as described above in FIGS. 1 and 2.

Figure 6B:
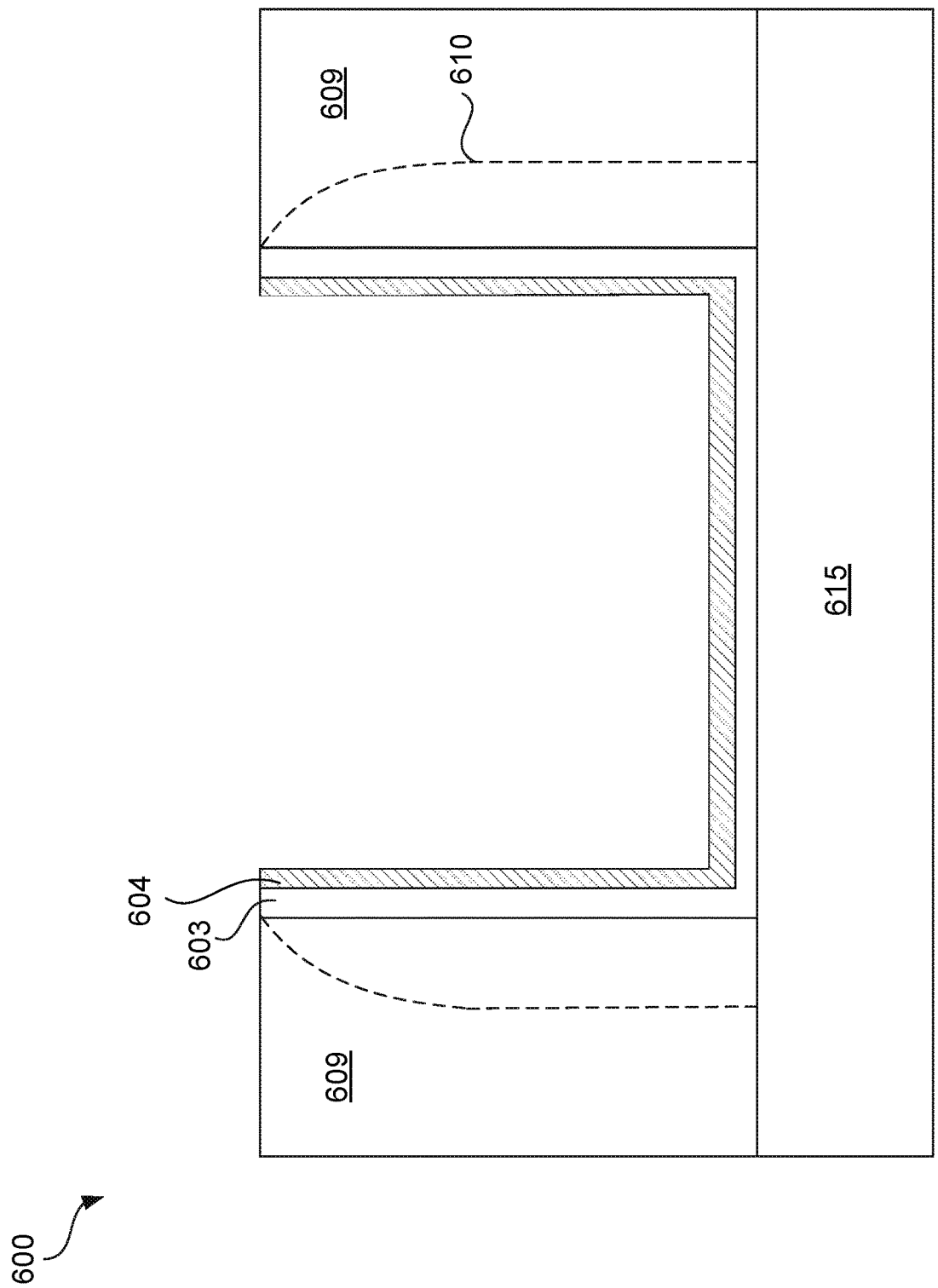

At operation 504, barrier layers are deposited in openings of a semiconductor device, in accordance with some embodiments of the present disclosure. Referring to FIG. 6B, barrier layer 604 is deposited in an opening of semiconductor device 600. The openings can be a high aspect ratio (e.g., greater than about 6) opening, such as gate trenches, vias, interconnects, and other high aspect ratio openings. An example of a barrier layer is barrier layer 604 formed on high-k dielectric layer 603, as shown in FIG. 6B. In some embodiments, the barrier layer can include TiN, TaN, any other suitable barrier layer material, and/or combinations thereof. The barrier layer can be formed after the high-k dielectric layer and formed using various deposition techniques, such as ALD, PVD, CVD, PECVD, other suitable deposition processes, and/or combinations thereof. In some embodiments, the barrier layer can have a substantially uniform thickness between about 10 Å and about 30 Å.

Figure 6C:
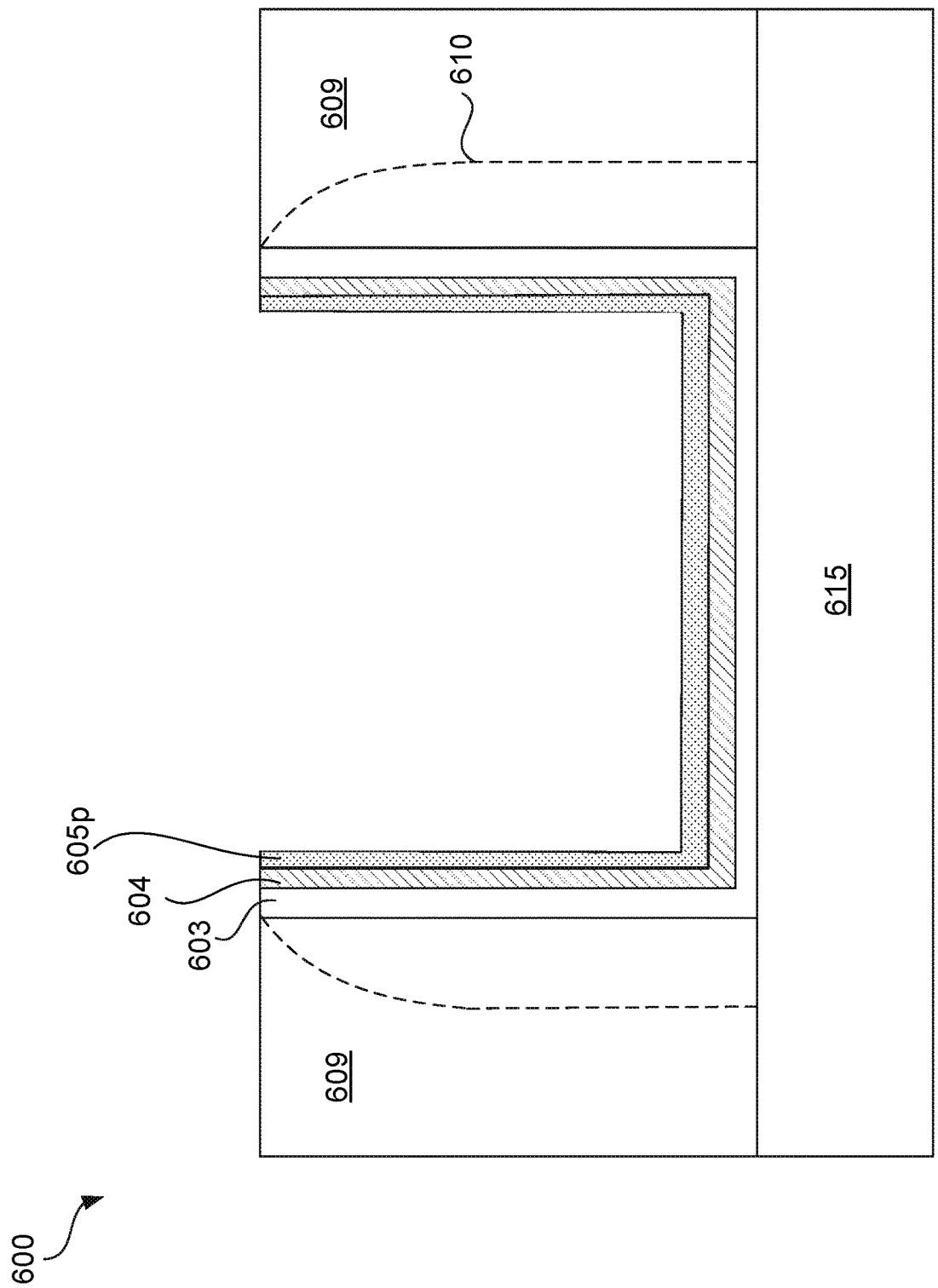

At operation 506, p-type work function layers are deposited in openings of a semiconductor device, in accordance with some embodiments of the present disclosure. The openings can be a high aspect ratio (e.g., greater than about 6) opening, such as gate trenches, vias, interconnects, and other high aspect ratio openings. In some embodiments, semiconductor transistor device can be a p-type device including a p-type work function layer formed on an n-type work function layer. An example of a p-type work function layer is p-type work function layer 605p formed on barrier layer 604, as shown in FIG. 6C. The combined n-type and p-type work function layers can provide appropriate work function value to achieve a nominal transistor threshold voltage for p-type devices. In some embodiments, p-type work function layer can include TiN, any other suitable work function layer material, and/or combinations thereof. P-type work function layer can be formed after n-type work function layer and formed using various deposition techniques, such as ALD, PVD, CVD, PECVD, other suitable deposition processes, and/or combinations thereof. In some embodiments, p-type work function layer can have a substantially uniform thickness between about 5 Å and about 50 Å.

Figure 6D:
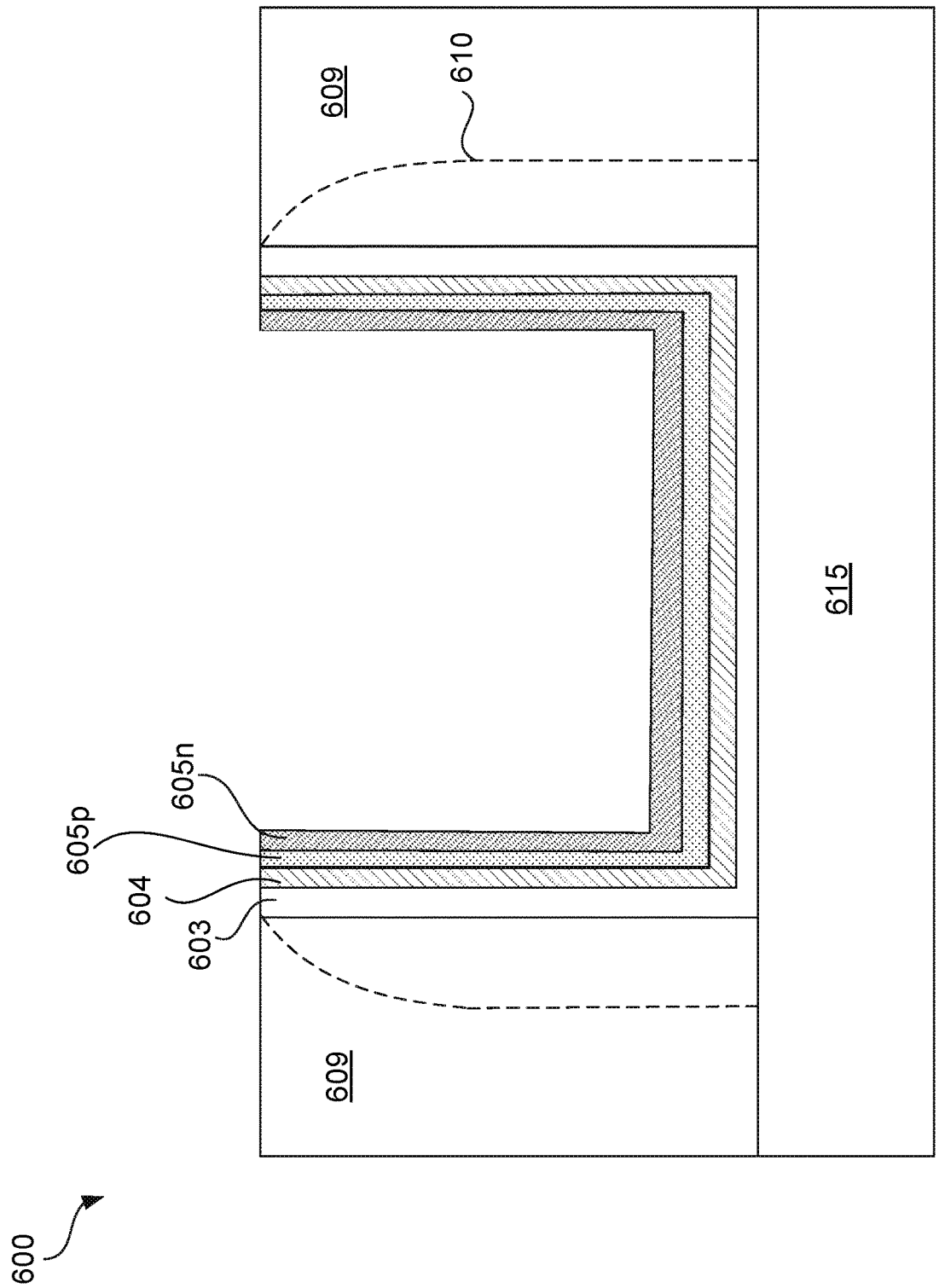

At operation 508, n-type work function layers are deposited in openings of a semiconductor device, in accordance with some embodiments of the present disclosure. Referring to FIG. 6D, n-type work function layer 605n can be deposited in the openings of semiconductor device 600. The openings can be a high aspect ratio (e.g., greater than about 6) opening, such as gate trenches, vias, interconnects, and other high aspect ratio openings. One or more n-type work function layers can be deposited, in accordance with some embodiments. An example of an n-type work function layer is n-type work function layer 605n formed on p-type work function layer 605n, as shown in FIG. 6D. N-type work function layers can provide appropriate work function value to achieve a nominal transistor threshold voltage for a semiconductor transistor device. In some embodiments, an n-type work function layer can include TiAlC, TaAlC, TiSiC, any other suitable n-type work function layer material, and/or combinations thereof. N-type work function layers can be formed after barrier layer deposition and formed using various deposition techniques such as ALD, PVD, CVD, PECVD, other suitable deposition processes, and/or combinations thereof. In some embodiments, n-type work function layers can have a substantially uniform thickness between about 10 Å and about 50 Å.

Figure 6E:
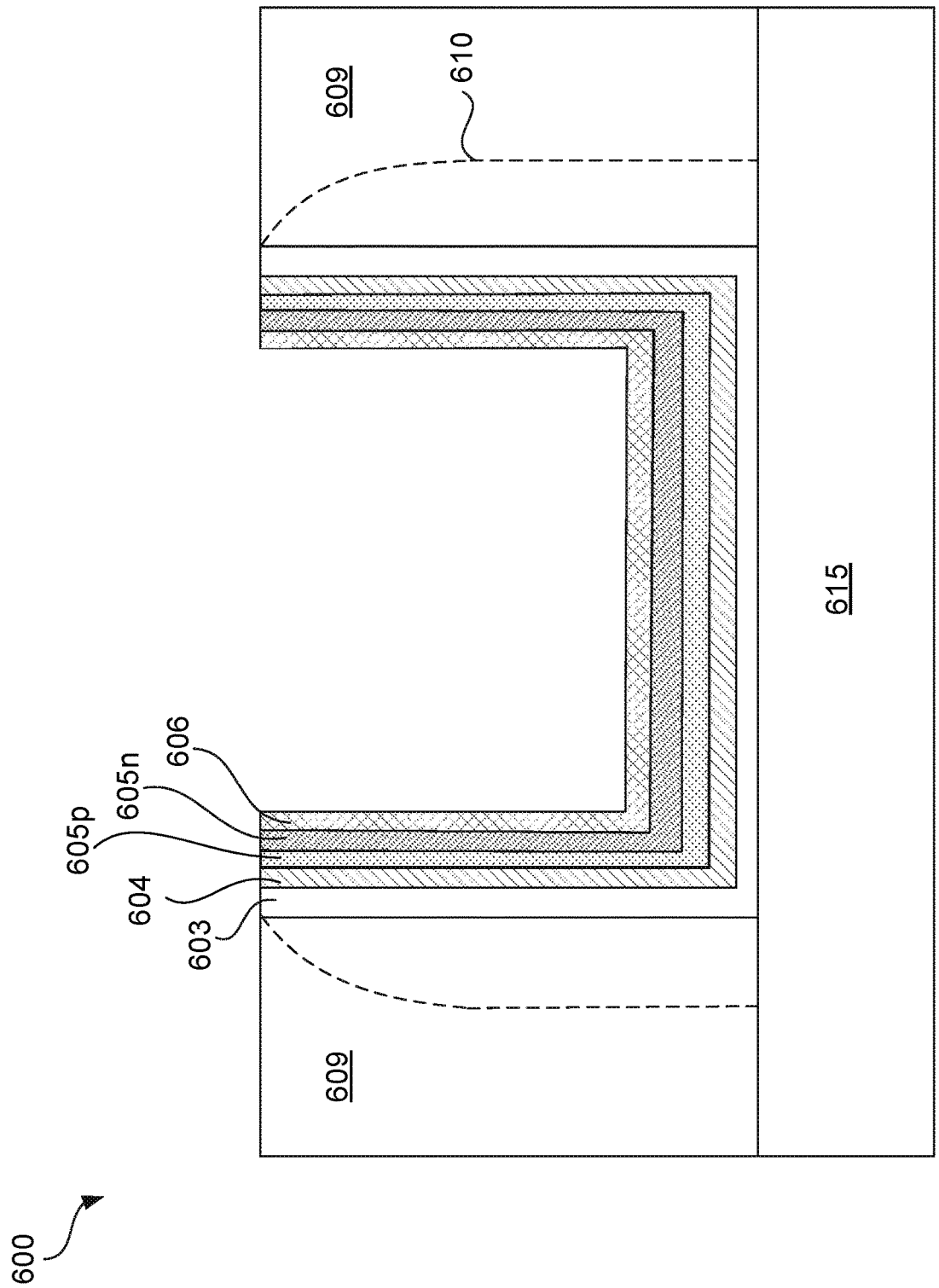

At operation 510, blocking layers are deposited in openings of a semiconductor device, in accordance with some embodiments of the present disclosure. Referring to FIG. 6E, a blocking layer 606 can be deposited in openings of semiconductor device 600. The openings can be a high aspect ratio (e.g., greater than about 6) opening, such as gate trenches, vias, interconnects, and other high aspect ratio openings. Blocking layers can be formed on n-type or p-type work function layers, in accordance with some embodiments. Blocking layers can be formed on the work function layers in an in-situ manner, preventing the underlying work function layer from contamination or oxidation. Blocking layers can also be formed in a different deposition chamber within the same cluster tool or using a different deposition tool. Blocking layers can include TiN, TaN, TSN, any other suitable material, and/or combinations thereof. In some embodiments, blocking layers can have a thickness ranging from about 5 Å to about 40 Å. Blocking layers can be formed by various deposition techniques, such as ALD, PVD, CVD, PECVD, or other suitable techniques. In some embodiments, the blocking layer 106 can be an optional layer that can be removed. Other examples of blocking layers can be blocking layers 106 and 206 as described above in FIGS. 1-3B.

Figure 6F:
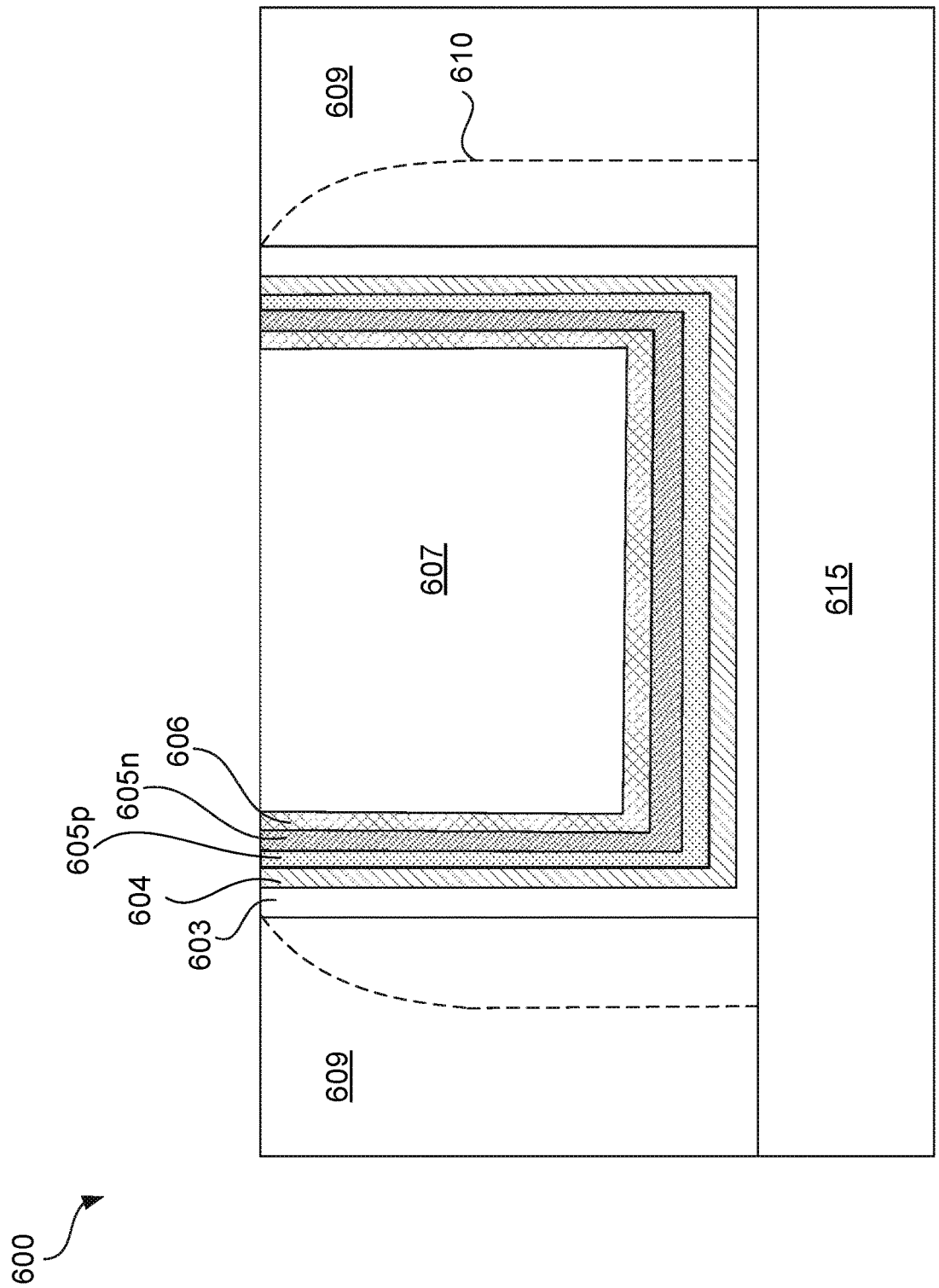

At operation 512, metal layers are deposited in openings of a semiconductor device, in accordance with some embodiments of the present disclosure. Referring to FIG. 6F, metal layers 607 are deposited in openings of semiconductor device 600. The openings can be a high aspect ratio (e.g., greater than about 6) opening, such as gate trenches, vias, interconnects, and other high aspect ratio openings. Metal layers can be formed to fill in a remainder of a gate trench in the metal gate stack. Metal layers can include tungsten, WN, TaN, ruthenium, silver, aluminum, any other suitable material, and/or combinations thereof. Metal layers can be formed using a damascene process followed by a planarization process to remove any excessive material formed on the top surface of the ILD layer. Other examples of metal layers can be metal layers 107 and 207 as described above in FIGS. 1-3B. Referring to FIG. 6F, a metal gate stack is formed including barrier layer 604, p-type work function layer 605p, n-type work function layer 605n, blocking layer 606, and metal layer 607. The metal gate stack is formed in gate trench 602 described above in FIG. 6A and can have the same aspect ratio as gate trench 602. Therefore, the metal gate stack can have an aspect ratio between about 6 and about 66.

Metal layers such as metal layers 607 can be formed using a UV activated ALD deposition process. The UV activated ALD process can include flowing a first precursor into a deposition chamber, applying a first UV radiation to activate the functional groups of the first precursor, purging the chamber to remove excessive first precursors, flowing a second precursor into the deposition chamber, applying a second UV radiation to activate the functional groups of the second precursor, and purging the chamber to remove excessive second precursors. The UV activated ALD process can be repeated until a nominal thickness of metal layer is achieved or openings of the semiconductor structure is filled.

Figure 7:
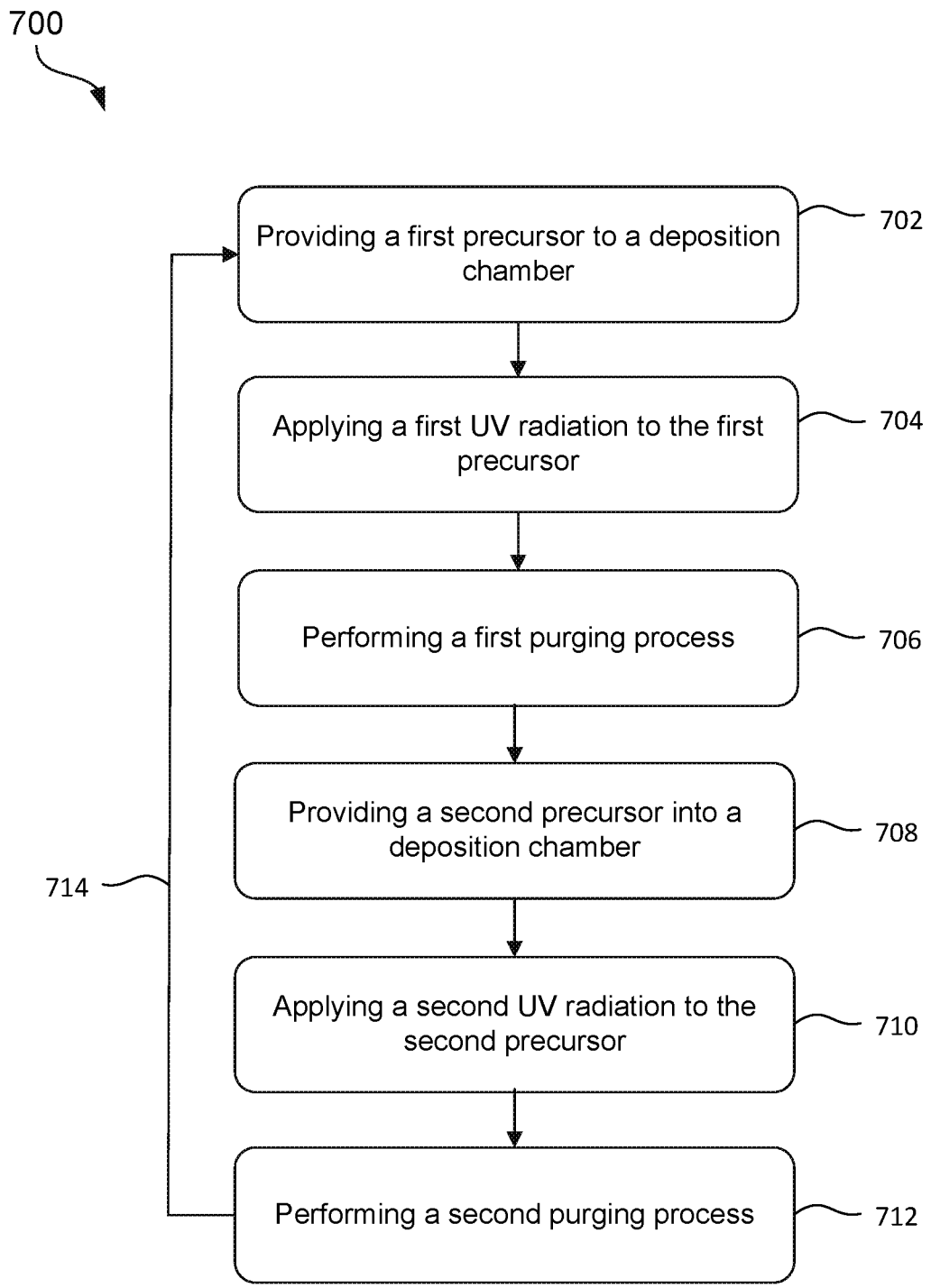
FIG. 7 is a flow diagram of an exemplary method of forming metal layers using multi-cycle deposition and UV activation processes, in accordance with some embodiments.

FIG. 7 is a flow diagram of an exemplary method 700 of forming metal layers with improved uniformity and lower impurity level in semiconductor structures, in accordance with some embodiments of the present disclosure. Metal layers such as metal layers 207 and 607 can be formed using method 700. Operations of method 700 can be performed in a different order and/or vary, and method 700 may include more operations and are not described for simplicity. Exemplary method 700 can also be used to form metal layers having improved purity levels. The metal layers can be used in any suitable semiconductor structures, for example, in contacts, vias, and/or interconnects.

At operation 702, a first precursor is provided to a deposition chamber, according to some embodiments. An example of the deposition chamber can be deposition chamber 409 described in FIG. 4. The first and/or second precursors can include an element of interest, a photoactive group, and a reactive group. The element of interest can be a metal material that is to be deposited; for example, the element of interest can be tungsten, titanium, copper, hafnium, aluminum, silver, or any suitable metal in its atomic form. In some embodiments, the element of interest can be clusters of metal atoms. In some embodiments, the element of interest can be single atoms. The photoactive group of the precursors can include functional groups that become active and react with reactive groups from other precursors. Functional groups can become active under suitable stimulation of UV radiation through various photoreaction schemes. For example, functional groups containing photo-crosslinkers can become active through a photo-protection process where suitable UV radiation provides sufficient energy to break off photo cross-link agents in the functional group. As such, the photo-protection process utilizes photo-activation processes to obtain materials with stronger mechanical properties. In some embodiments, functional groups can include function groups that cause 2+2 cycloaddition reactions. For example, the function groups can include Benzoates. In some embodiments, functional groups can include photo-initiators and crosslinkers. In another example, functional groups of the first precursor can become active through UV activation and generate free radicals to polymerize with ligands from a second precursor. Examples of functional groups can include acrylates, methacrylates, vinyl groups, and any other suitable functional groups. In a further example, UV radiation can remove unwanted ligands from the first precursor such that remaining ligands can react with a second precursor. In some embodiments, functional groups of precursors can include organometallic molecules.

As such, first precursor that become active under UV activation can include any suitable functional groups. For example, first precursor can include photo-initiators such as Acetophenone, Anisoin, Benzyl, Benzoin, Benzoin ethyl ether, Benzoin methyl ether, 4-Benzoylbiphenyl, 2-Benzyl-2-(dimethylamino)-4'-morpholinobutyrophenone, 4,4'-Bis(dimethylamino)benzophenone, 2-Chlorothioxanthen-9-one, 5-Dibenzosuberenone, 2,2-Diethoxyacetophenone, 2,2-Dimethoxy-2-phenylacetophenone, 4-(Dimethylamino)benzophenone, 3,4-Dimethylbenzophenone, 4'-Ethoxyacetophenone, 3-Hydroxybenzophenone, 4-Hydroxybenzophenone, 1-Hydroxycyclohexyl phenyl ketone, 2-Hydroxy-2-methylpropiophenone, 2-Methylbenzophenone, 3-Methylbenzophenone, Methybenzoylformate, 2-Methyl-4'-(methylthio)-2-morpholinopropiophenone, 4'-Phenoxyacetophenone, or any suitable photo-initiators.

The first precursor can be pulsed into the deposition chamber under vacuum for a predetermined amount of time to allow the first precursor to fully react with the wafer surface. For example, first precursor can form a layer of first precursor molecules on exposed surfaces of the wafer, such as exposed surfaces of a gate opening. An example of providing the first precursor to the deposition chamber can be providing the first precursor to deposition chamber 409 through precursor supply 420, as illustrated in FIG. 4.

In operation 704, a first UV radiation process is applied to the first precursor in the deposition chamber, according to some embodiments. The first radiation process is performed to activate functional groups of the first precursor in the deposition chamber through photoreactions. In some embodiments, UV radiation can be applied to the deposition chamber by suitable apparatus. For example, UV radiation can be applied to deposition chamber 409 through UV radiation source 424. The wavelength of the first UV radiation can be selected to provide sufficient energy for activating the functional groups of the first precursor. Energy provided by UV radiation is inversely proportional to its wavelength. For example, UV radiation having a longer wavelength carries lower energy than UV radiation having a shorter wavelength. Exemplary wavelength values below for various precursors provide sufficient energy to activate the corresponding precursor, and wavelengths greater or lower than these values could result in low absorption by the precursor which in turn could result in low activation rates for the precursor. Exemplary wavelengths for the first precursor can be between about 100 nm and about 500 nm. In some embodiments, first UV radiation having wavelength about 240 nm can be applied to first precursors such as Acetophenone. In some embodiments, first UV radiation having wavelength between about 220 nm and about 280 nm can be applied to first precursors such as Anisoin. In some embodiments, first UV radiation having wavelength between about 240 nm and about 260 nm can be applied to first precursors such as Benzyl. In some embodiments, first UV radiation having wavelength between about 240 nm and about 260 nm can be applied to first precursors such as Benzoin. In some embodiments, first UV radiation having wavelength between about 240 nm and about 260 nm can be applied to first precursors such as Benzoin ethyl ether. In some embodiments, first UV radiation having wavelength between about 240 nm and about 260 nm can be applied to first precursors such as Benzoin methyl ether. In some embodiments, first UV radiation having wavelength between about 280 nm and about 300 nm can be applied to first precursors such as 4-Benzoylbiphenyl. In some embodiments, first UV radiation having wavelength between about 300 nm and about 340 nm can be applied to first precursors such as 2-Benzyl-2-(dimethylamino)-4'-morpholinobutyrophenone. In some embodiments, first UV radiation having wavelength between about 350 nm and about 370 nm can be applied to first precursors such as 4,4'-Bis(dimethylamino) benzophenone. In some embodiments, first UV radiation having wavelength between about 260 nm and about 380 nm can be applied to first precursors such as 2-Chlorothioxanthen-9-one. In some embodiments, first UV radiation having wavelength between about 260 nm and about 360 nm can be applied to first precursors such as 5-Dibenzosuberenone. In some embodiments, first UV radiation having wavelength between about 240 nm and about 260 nm can be applied to first precursors such as 2,2-Diethoxyacetophenone. In some embodiments, first UV radiation having wavelength between about 240 nm and about 360 nm can be applied to first precursors such as 2,2-Dimethoxy-2-phenylacetophenone. In some embodiments, first UV radiation having wavelength between about 240 nm and about 360 nm can be applied to first precursors such as 4-(Dimethylamino)benzophenone. In some embodiments, first UV radiation having wavelength between about 255 nm and about 265 nm can be applied to first precursors such as 3,4-Dimethylbenzophenone. In some embodiments, first UV radiation having wavelength between about 260 nm and about 280 nm can be applied to first precursors such as 4'-Ethoxyacetophenone. In some embodiments, first UV radiation having wavelength between about 250 nm and about 320 nm can be applied to first precursors such as 3-Hydroxybenzophenone. In some embodiments, first UV radiation having wavelength between about 220 nm and about 300 nm can be applied to first precursors such as, 4-Hydroxybenzophenone. In some embodiments, first UV radiation having wavelength between about 235 nm and about 245 nm can be applied to first precursors such as 1-Hydroxycyclohexyl phenyl ketone. In some embodiments, first UV radiation having wavelength between about 235 nm and about 245 nm can be applied to first precursors such as 2-Hydroxy-2-methylpropiophenone. In some embodiments, first UV radiation having wavelength between about 245 nm and about 255 nm can be applied to first precursors such as 2-Methylbenzophenone. In some embodiments, first UV radiation having wavelength between about 255 nm and about 265 nm can be applied to first precursors such as 3-Methylbenzophenone. In some embodiments, first UV radiation having wavelength between about 230 nm and about 320 nm can be applied to first precursors such as Methybenzoylformate, 2-Methyl-4'-(methylthio)-2-morpholinopropiophenone. In some embodiments, first UV radiation having wavelength between about 260 nm and about 280 nm can be applied to first precursors such as 4'-Phenoxyacetophenone. In some embodiments, the first UV radiation process can be applied for any suitable period of time. For example, the first UV radiation can be applied for a period of time between about 0.1 ms to about 120 s. In some embodiments, the first UV radiation can activate the photoactive group of the first precursor without the application of plasma.

In operation 706, a first purging process using an inert gas such as nitrogen or argon is performed in the reaction chamber to remove portions of the first precursor such as any unreacted first precursor material and reaction by-products. In some embodiments, the inert gas used in the first purging process can include hydrogen, helium, any other suitable inert gases, and/or combinations thereof. The first purging process can be performed through purging lines 428 described in FIG. 4.

In operation 708, a second precursor is provided into the deposition chamber, according to some embodiments. The second precursor can be provided to a deposition chamber such as deposition chamber 409 through precursor supply 422. The second precursor is provided into the deposition chamber to allow surface reaction with the first precursor and form one or more atomic layers of the deposited metal. In some embodiments, the second precursor can also include a photoactive group, a reactive group, and the element of interest. The photoactive group (e.g., functional group) of the second precursor can be different from the photoactive group of the first precursor, such that the photoactive group of the second precursor can be activated using a different UV radiation wavelength than the first precursor. Such configuration prevents the second UV radiation from reactivating the deposited first precursor by using a different wavelength for the second UV radiation that is different from the wavelength of the first UV radiation. For example, the first precursor can be Benzoin methyl ether that is activated using the first UV radiation having wavelength between about 240 nm and about 260 nm, and the second precursor can be 4-Benzoylbiphenyl that is activated using the second UV radiation having wavelength between about 280 nm and about 300 nm. In some embodiments, the first precursor can be benzyl and the second precursor can be 4-Benzoylbiphenyl. In some embodiments, the first precursor can be 4'-Ethoxyacetophenone and the second precursor can be 4,4'-Bis(dimethylamino)benzophenone. In some embodiments, the first precursor can be 4'-Phenoxyacetophenone and the second precursor can be 1-Hydroxycyclohexyl phenyl ketone.

In operation 710, a second UV radiation process is applied to the second precursor in the deposition chamber, according to some embodiments. The second radiation process is performed to activate functional groups of the second precursor in the deposition chamber through photoreactions. As discussed about with reference to operation 708, the wavelength of the second UV radiation process can be different from the wavelength of the first UV radiation process. In some embodiments, the second UV radiation process can be applied for any suitable period of time. The reaction group of the second precursor can react with the activated photoactive group of the first precursor such that a second layer of desired material can be deposited on the first precursor material. In some embodiments, the second UV radiation can be applied for a period of time between about 0.1 ms to about 120 s. In some embodiments, because the second precursor can react with the activated first precursor, the process can be completed in the deposition chamber without the activation of plasma.

In operation 712, a second purging process using an inert gas such as nitrogen or argon is performed in the reaction chamber to remove portions of the first precursor such as any unreacted second precursor material and reaction by-products. In some embodiments, the inert gas used in the second purging process can include hydrogen, helium, any other suitable inert gases, and/or combinations thereof. The second purging process can be performed through purging lines 428 described in FIG. 4.

In operation 714, the deposition and UV radiation process can be repeated until a nominal thickness of metal layers can be formed. For example, a greater thickness of the deposited metal layer can be achieved by performing a greater number of deposition and UV activation cycles.

Various embodiments in accordance with this disclosure provide methods of forming metal layers with improved purity. In some embodiments, the layers with improved purity formed using methods described in the present disclosure can include metal compound layers and are collectively described as "metal layers" for simplicity. The metal layers with improved purity levels can be formed using a multi-cycle deposition and in-situ ultraviolet (UV) radiation activation process. The formation process can include flowing a first precursor into a deposition chamber, applying UV radiation in-situ to activate functional groups of the first precursor, purging the chamber to remove excessive first precursor material, flowing a second precursor into the deposition chamber, applying UV radiation in-situ to activate functional groups of the second precursor, purging the chamber to remove excessive second precursors, and repeating the deposition cycle until a nominal thickness of the metal material is deposited. The UV activation process can be performed in-situ (e.g., performed in the same chamber as the multi-cycle deposition process). In some embodiments, the ALD deposition process can be completed without activating plasma. In some embodiments, the deposited metal layer contains low levels of impurity. Nominal thickness and the deposited metal layers can be varied by adjusting at least the choice of precursors, choice of UV wavelengths, number of deposition cycles, other suitable parameters, and/or combinations thereof.

In some embodiments, a method of fabricating a semiconductor structure, the method includes forming an opening and depositing a metal layer in the opening. The depositing includes performing one or more deposition cycles, wherein each deposition cycle includes flowing a first precursor into a deposition chamber and performing an ultraviolet (UV) radiation process on the first precursor. The method further includes performing a first purging process in the deposition chamber to remove at least a portion of the first precursor, flowing a second precursor into the deposition chamber, and purging the deposition chamber to remove at least a portion of the second precursor.

In some embodiments, a method of fabricating a semiconductor transistor structure, the method includes forming an opening in a dielectric layer and depositing one or more work function layers in the opening. The method further includes depositing a metal layer on the one or more work function layers and depositing the metal layer includes flowing a first precursor into a deposition chamber. The method further includes performing a first ultraviolet (UV) radiation process on the first precursor, the first UV radiation process having a first wavelength. The method also includes performing a first purging process in the deposition chamber to remove at least a portion of the first precursor and flowing a second precursor into the deposition chamber. The method further includes performing a second UV radiation process on the second precursor, the second UV radiation process having a second wavelength different from the first wavelength. The method also includes purging the deposition chamber to remove at least a portion of the second precursor.

In some embodiments, a method of fabricating a semiconductor transistor structure, the method including forming a gate opening and depositing one or more work function layers in the opening. The method further includes depositing a metal layer on the one or more work function layers and depositing the metal layer includes flowing a first precursor into a deposition chamber. The method further includes performing a first ultraviolet (UV) radiation process on the first precursor, the first UV radiation process having a first wavelength and flowing a second precursor into the deposition chamber. The method further includes performing a second UV radiation process on the second precursor, the second UV radiation process having a second wavelength different from the first wavelength.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method of fabricating a semiconductor structure, the method comprising:
   forming an opening; and
   depositing a metal layer in the opening, wherein the depositing comprises:
     performing one or more deposition cycles, wherein each deposition cycle comprises:
       flowing a first precursor into a deposition chamber;
       performing an ultraviolet (UV) radiation process on the first precursor;
       performing a first purging process in the deposition chamber to remove at least a portion of the first precursor;
       flowing a second precursor different from the first precursor into the deposition chamber;
       performing an other UV radiation on the second precursor; and
       purging the deposition chamber to remove at least a portion of the second precursor.

2. The method of claim 1, wherein performing the one or more deposition cycles comprises repeating the deposition cycle to deposit a nominal thickness of the metal layer.

3. The method of claim 1, wherein performing the UV radiation process comprises activating a photoactive group of the first precursor.

4. The method of claim 1, further comprising depositing a work function layer in the opening.

5. The method of claim 1, wherein a wavelength of the UV radiation process is different from a wavelength of the other UV radiation process.

6. The method of claim 1, wherein the first and second precursors comprise benzyl and 4-Benzoylbiphenyl, respectively.

7. The method of claim 1, wherein a wavelength of the UV radiation process is between 240 nm and 260 nm and a wavelength of the other UV radiation process is between 280 nm and 300 nm.

8. The method of claim 1, wherein a wavelength of the UV radiation process is less than a wavelength of the other UV radiation process.

9. The method of claim 1, wherein the UV radiation process is performed for a time period between 0.1 ms and 120 s.

10. The method of claim 1, wherein the first and second precursors comprise 4'-Phenoxyacetophenone and 1-Hydroxycyclohexyl phenyl ketone, respectively.

11. A method of fabricating a semiconductor transistor structure, the method comprising:
    forming an opening in a dielectric layer;
    depositing one or more work function layers in the opening; and
    depositing a metal layer on the one or more work function layers, wherein depositing the metal layer comprises:
      flowing a first precursor into a deposition chamber;
      performing a first ultraviolet (UV) radiation process on the first precursor, the first UV radiation process comprising a first wavelength;
      performing a first purging process in the deposition chamber to remove at least a portion of the first precursor;
      flowing a second precursor into the deposition chamber;
      performing a second UV radiation process on the second precursor, the second UV radiation process comprising a second wavelength different from the first wavelength; and
      purging the deposition chamber to remove at least a portion of the second precursor.

12. The method of claim 11, wherein performing the first UV radiation process comprises providing UV radiation without activating plasma in the deposition chamber.

13. The method of claim 11, wherein performing the first UV radiation process comprises activating a photoactive group of the first precursor.

14. The method of claim 11, wherein the first precursor comprises 4'-Ethoxyacetophenone and a wavelength of the first UV radiation process is between 260 nm and 280 nm.

15. The method of claim 11, wherein the second precursor comprises 4,4'-Bis(dimethylamino) benzophenone and a wavelength of the second UV radiation process is between 350 nm and 370 nm.

16. A method of fabricating a semiconductor transistor structure, the method comprising:
    forming an gate opening;
    depositing one or more work function layers in the opening; and
    depositing a metal layer on the one or more work function layers, wherein depositing the metal layer comprises:
      flowing a first precursor into a deposition chamber;
      performing a first ultraviolet (UV) radiation process on the first precursor, the first UV radiation process comprising a first wavelength;
      flowing a second precursor into the deposition chamber; and
      performing a second UV radiation process on the second precursor, the second UV radiation process comprising a second wavelength different from the first wavelength.

17. The method of claim 16, wherein performing the first UV radiation process comprises providing UV radiation without activating plasma in the deposition chamber.

18. The method of claim 16, wherein performing the first UV radiation process comprises activating a photoactive group of the first precursor.

19. The method of claim 16, wherein the first precursor comprises 4'-Phenoxyacetophenone and a wavelength of the first UV radiation process is between 260 nm and 280 nm.

20. The method of claim 16, wherein the second precursor comprises 1-Hydroxycyclohexyl phenyl ketone and a wavelength of the second UV radiation process is 240 nm.

* * * * *

UNITED STATES PATENT AND TRADEMARK OFFICE
CERTIFICATE OF CORRECTION

PATENT NO. : 11,211,244 B2
APPLICATION NO. : 16/745532
DATED : December 28, 2021
INVENTOR(S) : Ouyang et al.

Page 1 of 1

It is certified that error appears in the above-identified patent and that said Letters Patent is hereby corrected as shown below:

In the Claims

In Column 22, Claim 16, Line 32, delete "an" and insert -- a --, therefor.

Signed and Sealed this
Twenty-second Day of February, 2022

Drew Hirshfeld
*Performing the Functions and Duties of the*
*Under Secretary of Commerce for Intellectual Property and*
*Director of the United States Patent and Trademark Office*